(12) United States Patent
Dyer et al.

(10) Patent No.: US 7,122,437 B2
(45) Date of Patent: Oct. 17, 2006

(54) DEEP TRENCH CAPACITOR WITH BURIED PLATE ELECTRODE AND ISOLATION COLLAR

(75) Inventors: Thomas W. Dyer, Pleasant Valley, NY (US); Chun-yung Sung, Poughkeepsie, NY (US); Ravikumar Ramachandran, Pleasantville, NY (US); Ramachandra Divakaruni, Ossining, NY (US); Carl Radens, LaGrangeville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/741,203

(22) Filed: Dec. 19, 2003

(65) Prior Publication Data

US 2005/0133846 A1 Jun. 23, 2005

(51) Int. Cl.
*H01L 21/8242* (2006.01)

(52) U.S. Cl. ............... 438/386; 438/243; 438/244; 438/387; 438/700

(58) Field of Classification Search ........... 438/243, 438/244, 386, 387, 700, 702, 703, FOR. 220, 438/FOR. 430
See application file for complete search history.

(56) References Cited

U.S. PATENT DOCUMENTS 5,719,080 A * 2/1998 Kenney ............... 438/243

| | | | |
|---|---|---|---|
| 6,699,794 B1 * | 3/2004 | Flietner et al. | 438/700 |
| 6,794,217 B1 * | 9/2004 | Lee et al. | 438/72 |
| 6,828,615 B1 * | 12/2004 | Lee et al. | 257/301 |
| 2003/0032227 A1 * | 2/2003 | Ohara et al. | 438/197 |
| 2003/0098483 A1 * | 5/2003 | Lee et al. | 257/301 |
| 2003/0224605 A1 | 12/2003 | Tews et al. | |
| 2004/0262669 A1 * | 12/2004 | Shum et al. | 257/315 |
| 2005/0085096 A1 * | 4/2005 | Low et al. | 438/778 |

FOREIGN PATENT DOCUMENTS

DE 100 47 221 C1 3/2002

* cited by examiner

*Primary Examiner*—George R. Fourson
*Assistant Examiner*—Joannie Adelle Garcia
(74) *Attorney, Agent, or Firm*—Slater & Matsil, L.L.P.

(57) ABSTRACT

A deep trench capacitor used in a trench DRAM includes a buried plate and an isolation collar. The deep trench is bottle-shaped, and the isolation collar is formed in upper portion of the wider region of the bottle-shaped trench. The buried plate surrounds the lower portion of the wider part of the bottle-shaped trench, and hemispherical grain polysilicon lines the walls of at least the lower portion of the wider part of the trench. A nitride liner layer lines the inner walls of the oxide collar and prevents diffusion of dopant through the oxide collar into the substrate when the HSG polysilicon and the doped buried plate are formed. The buried plate region is self-aligned to the isolation collar. The depth of the top of the wider part of the bottle shape and the bottom depth of the isolation collar are determined by successive resist deposition and recessing steps.

26 Claims, 21 Drawing Sheets

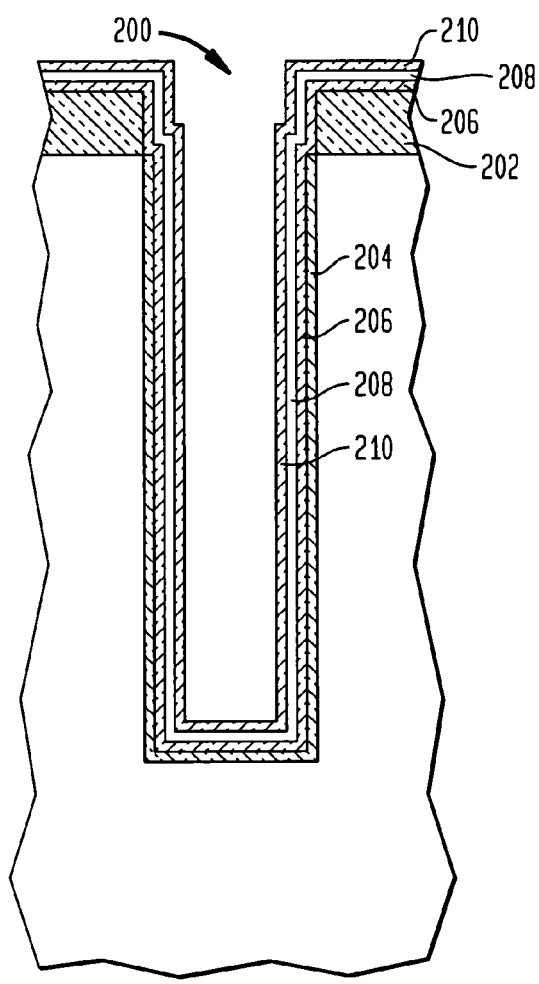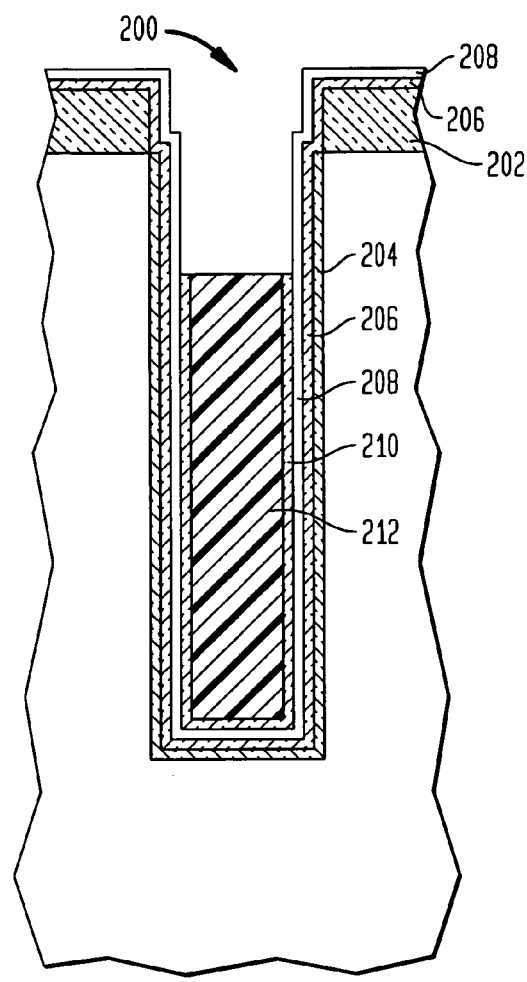

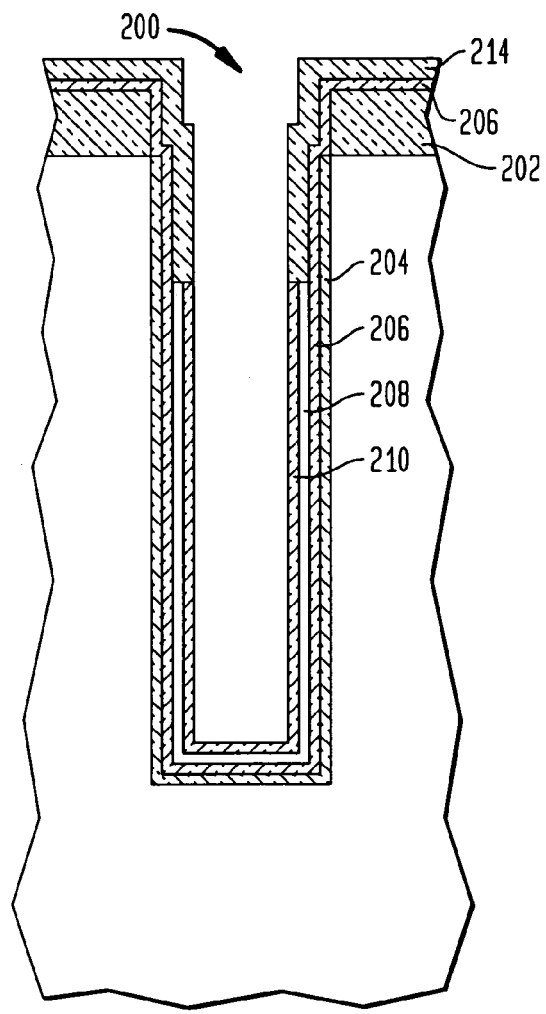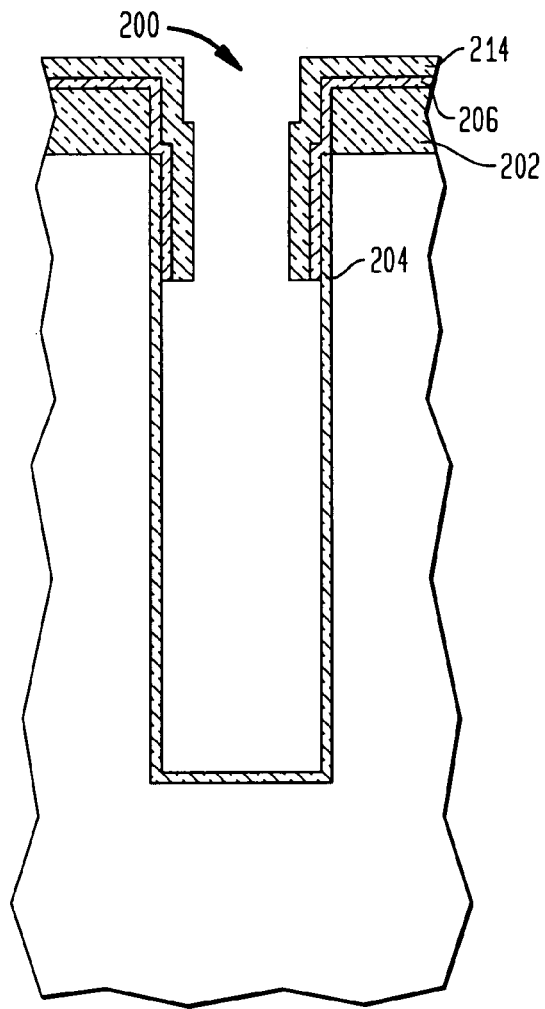

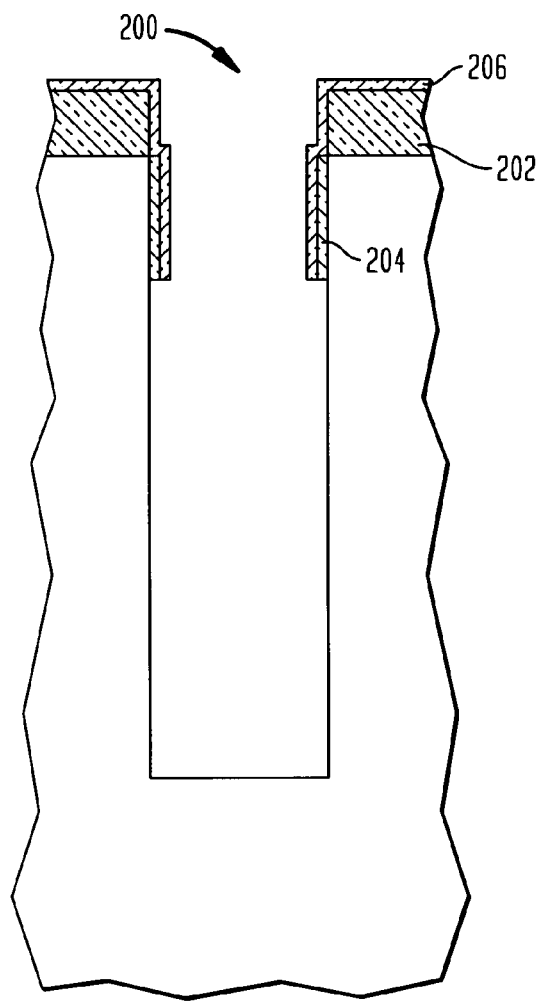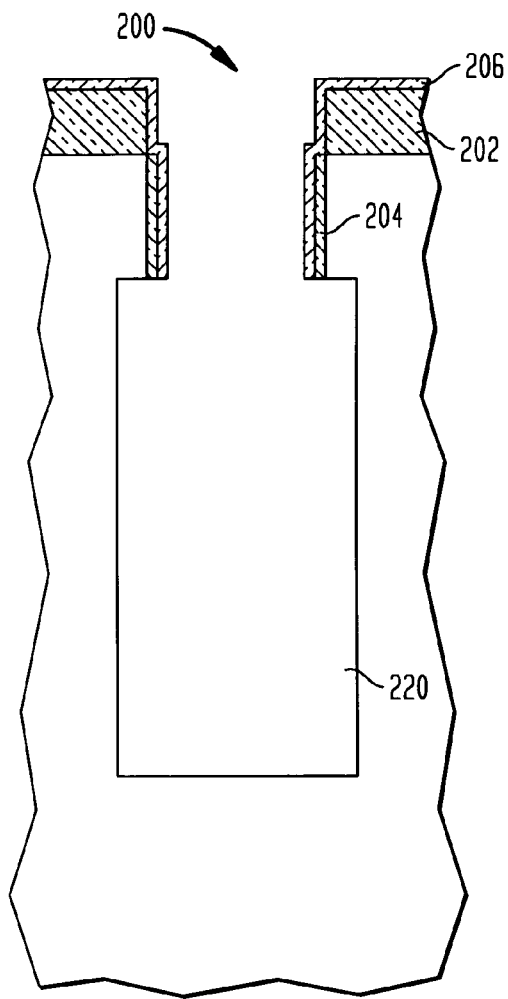

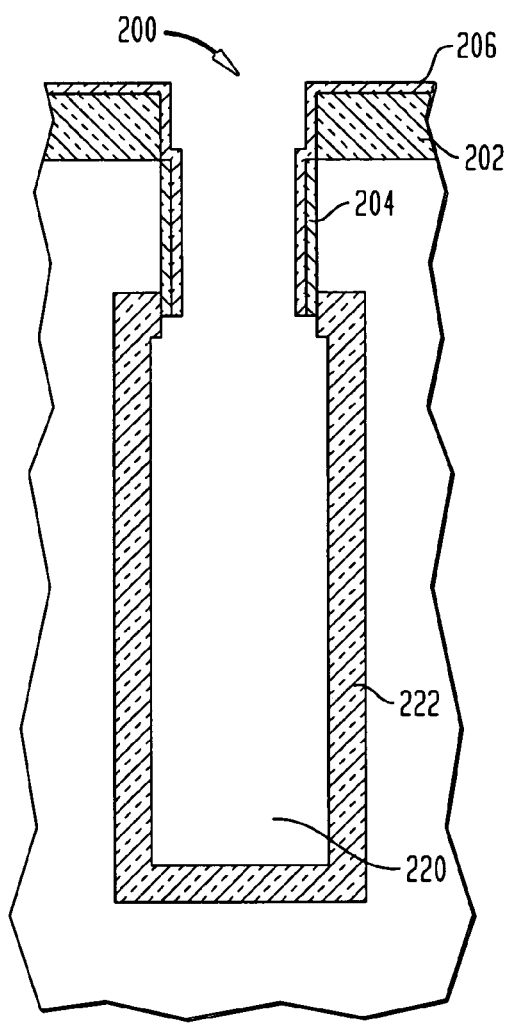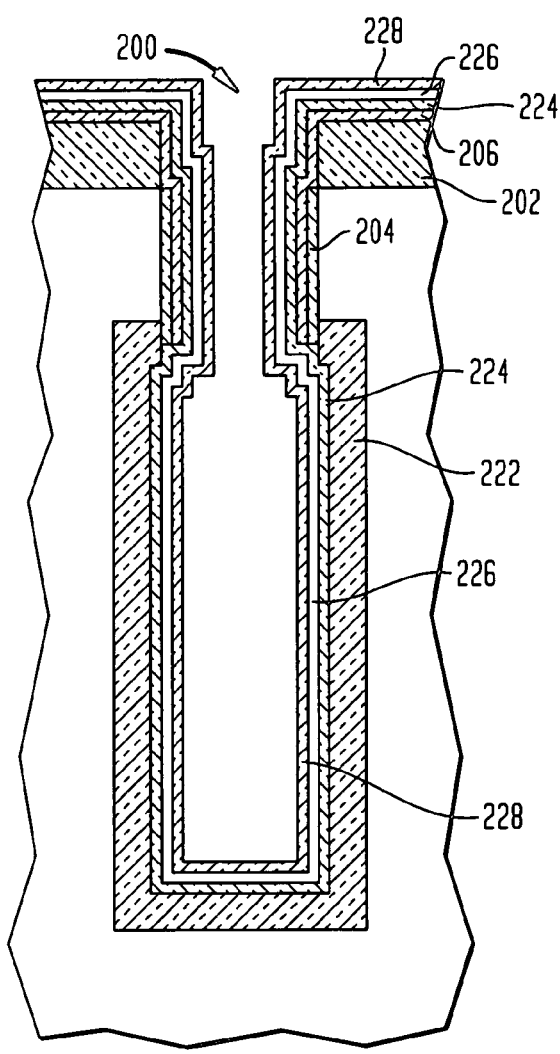

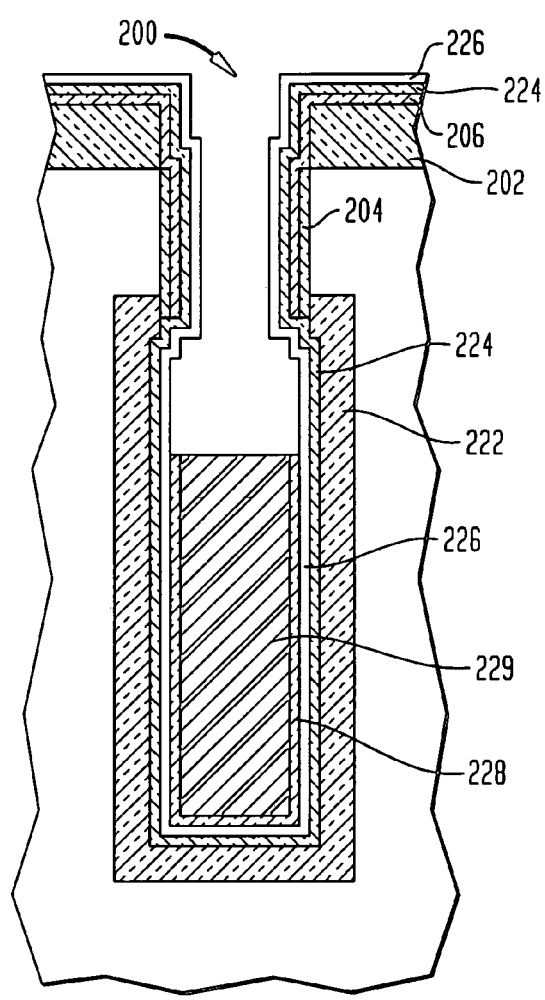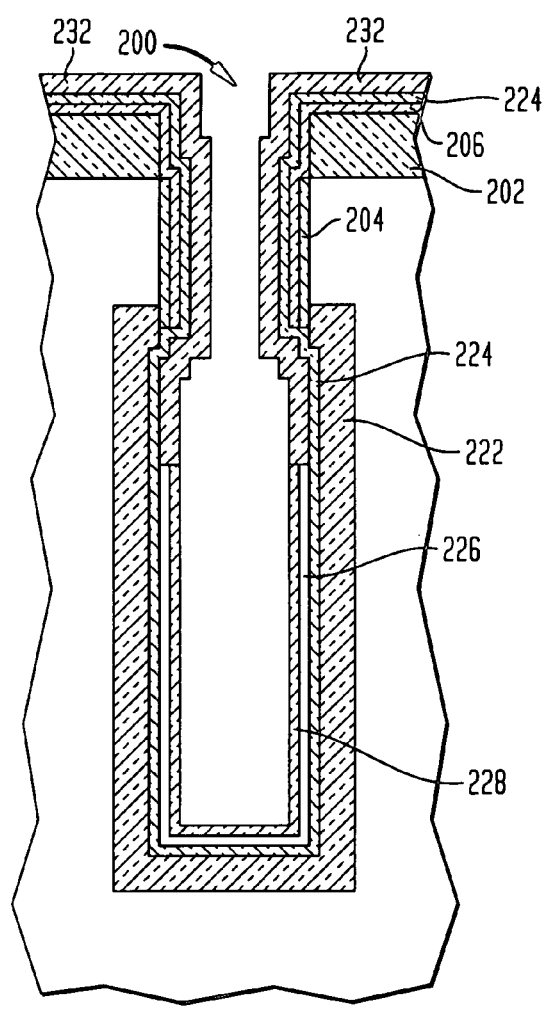

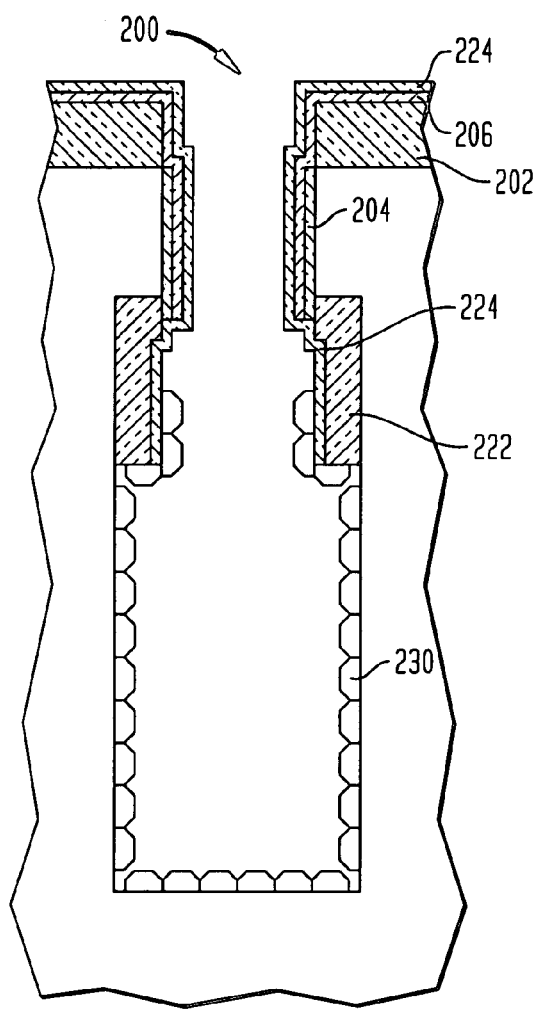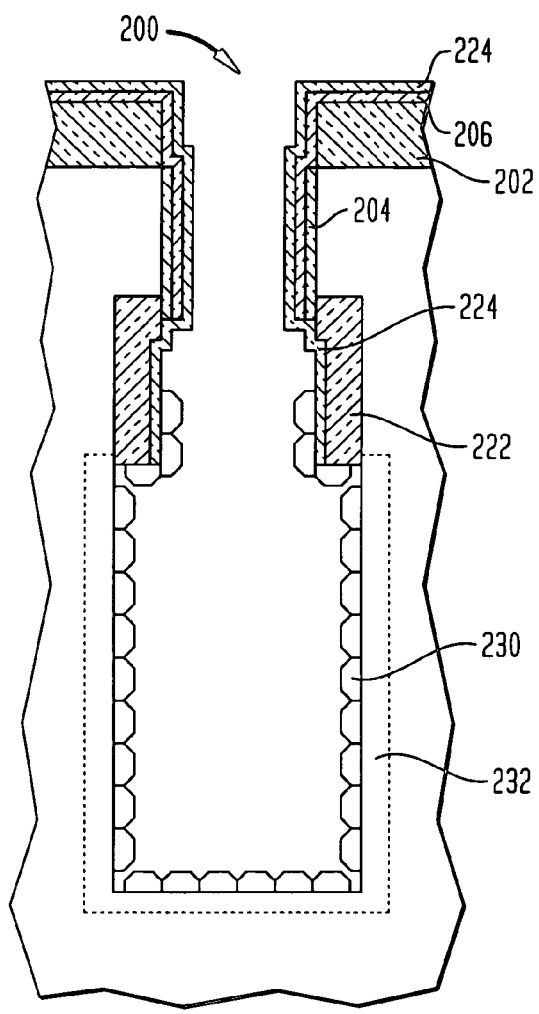

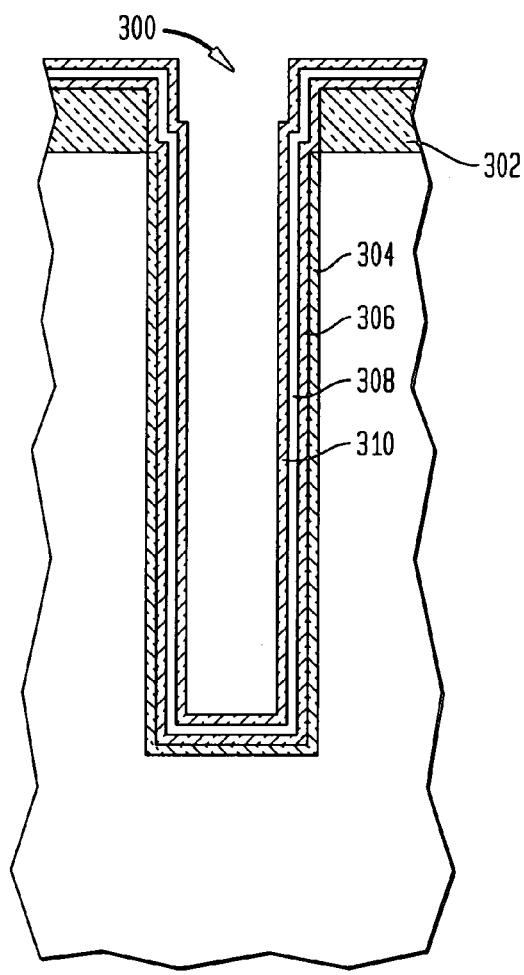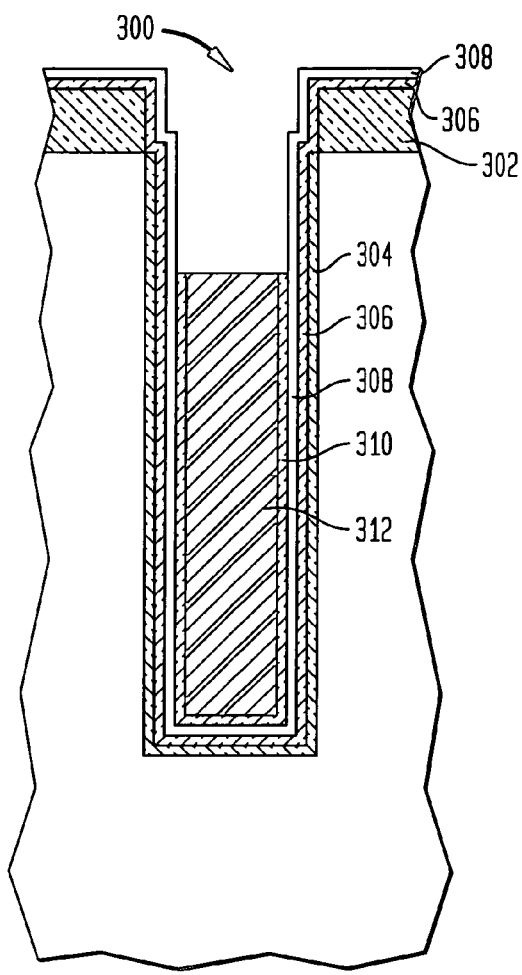

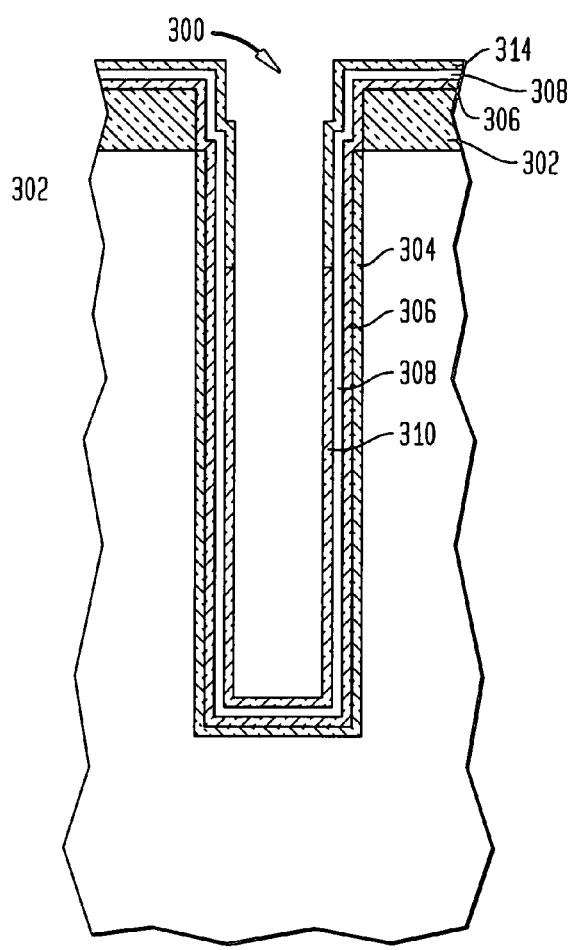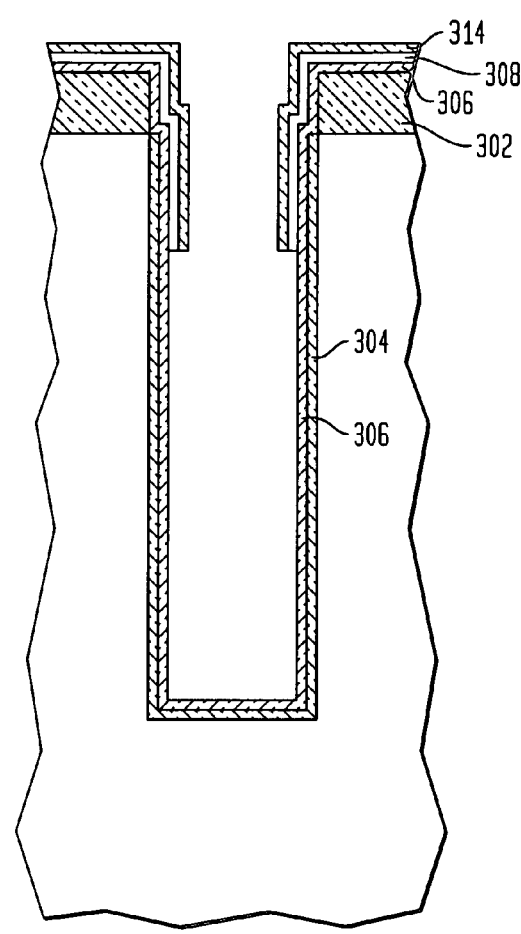

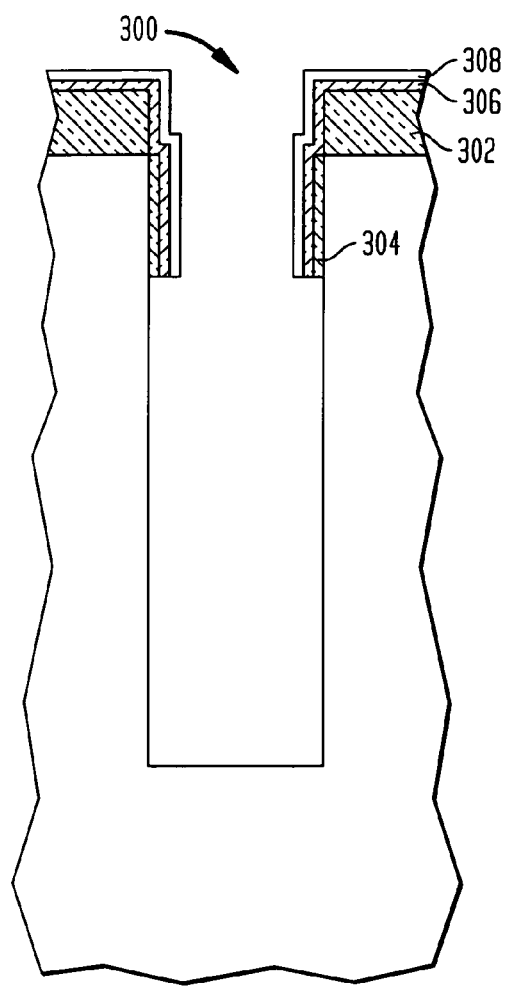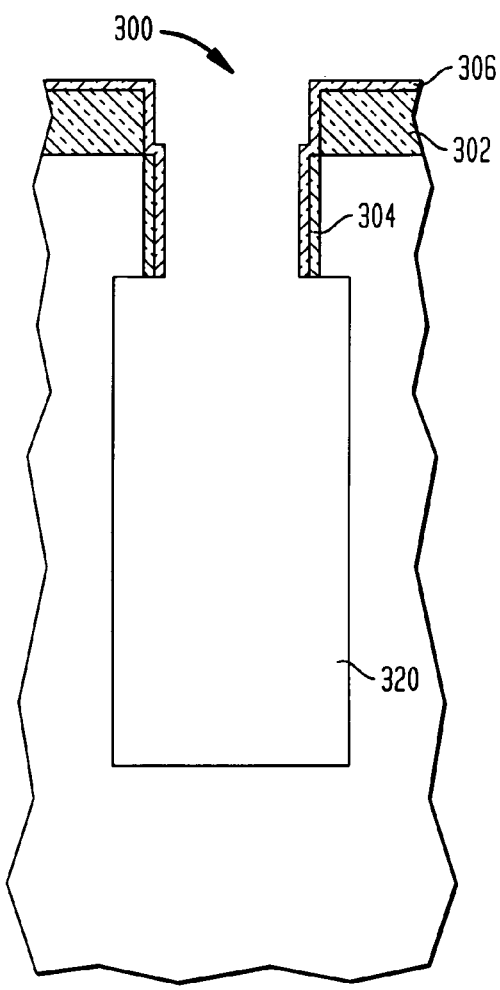

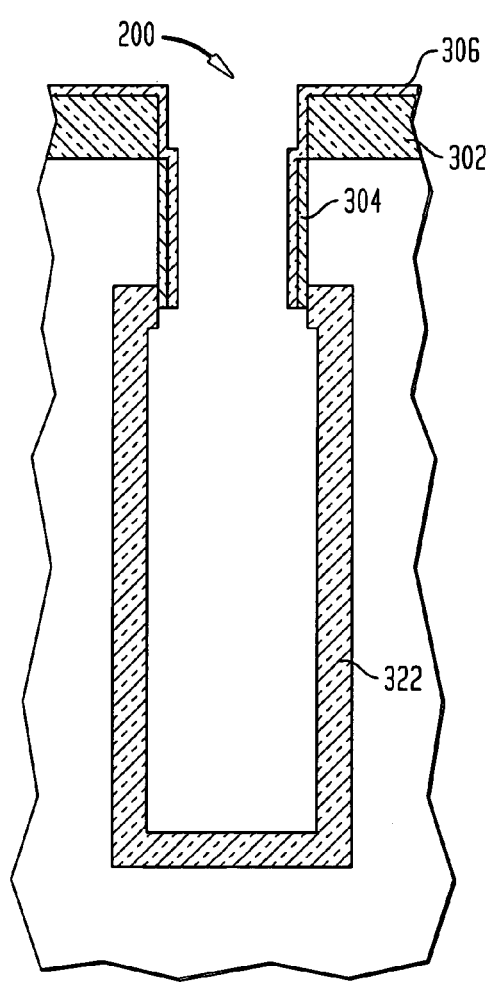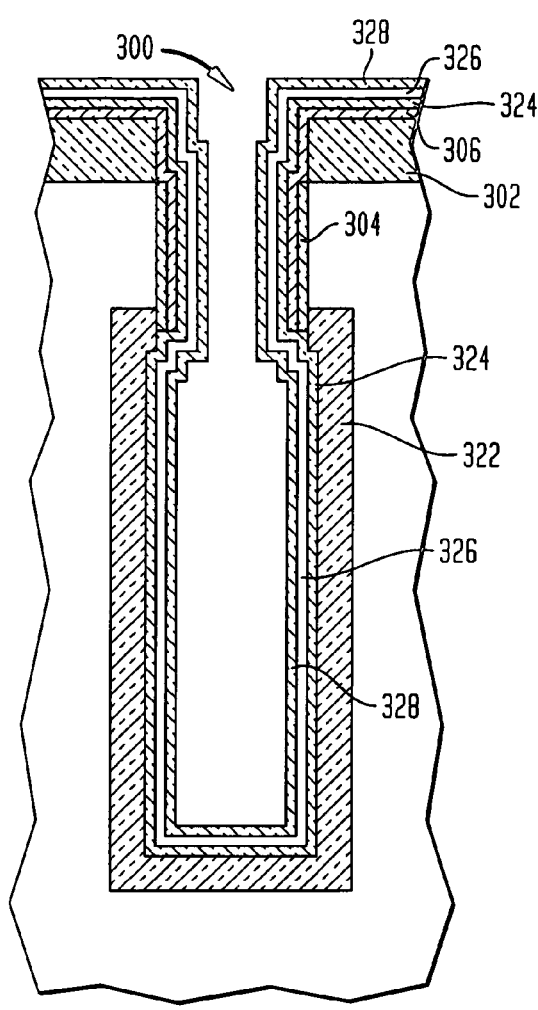

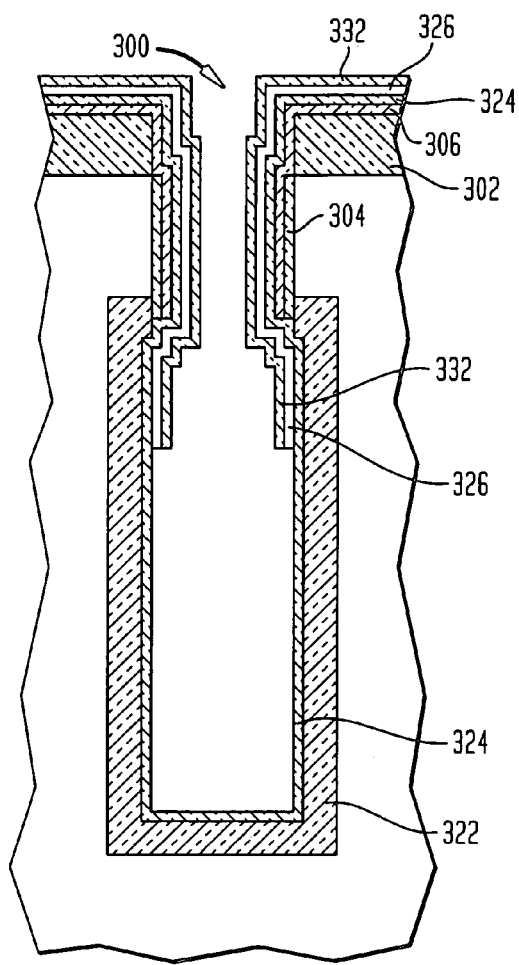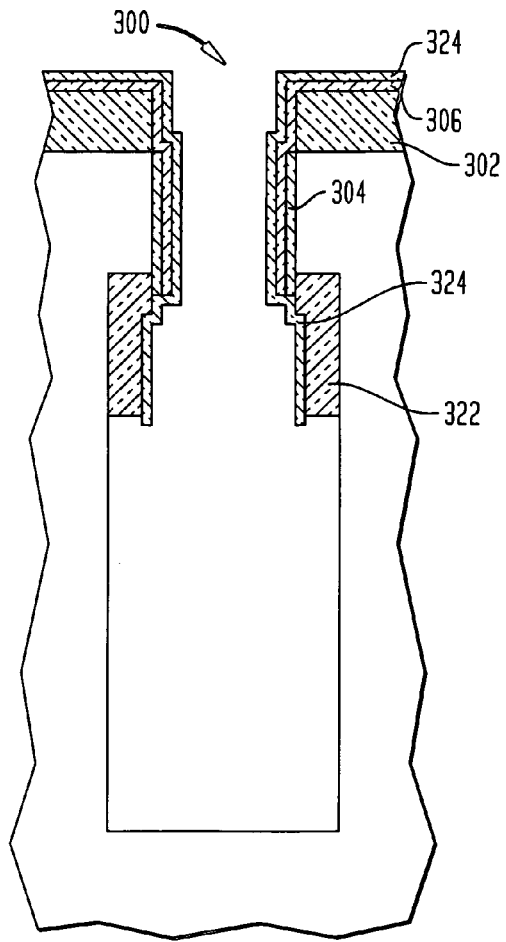

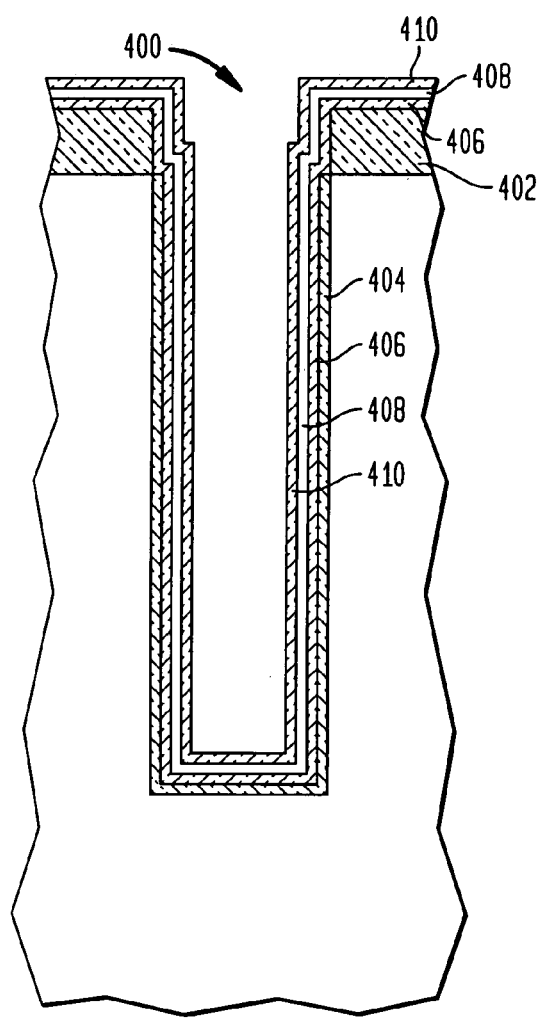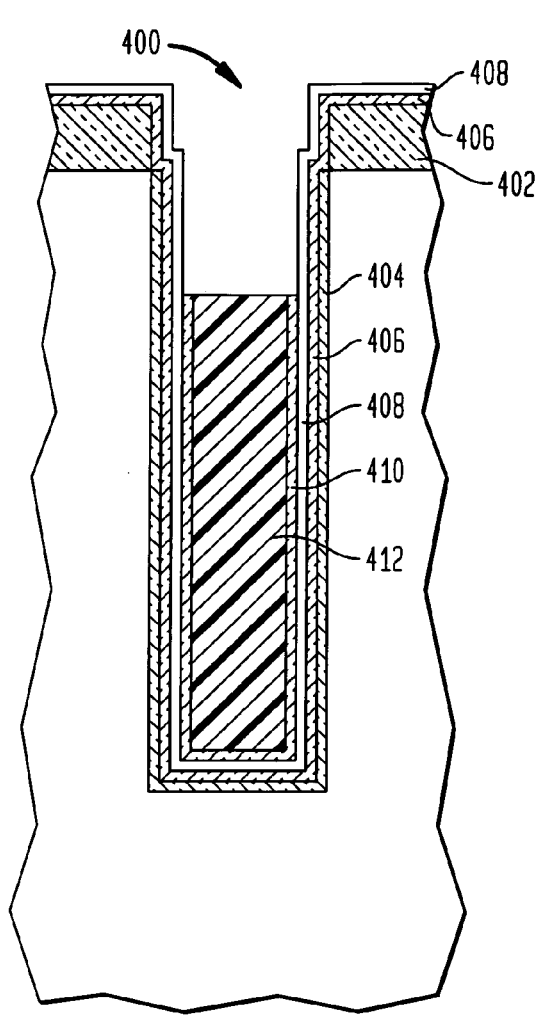

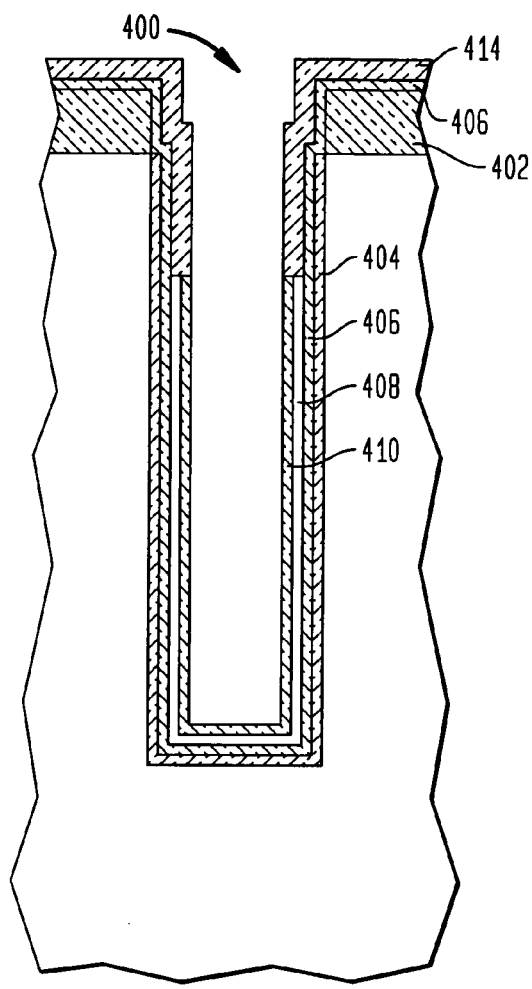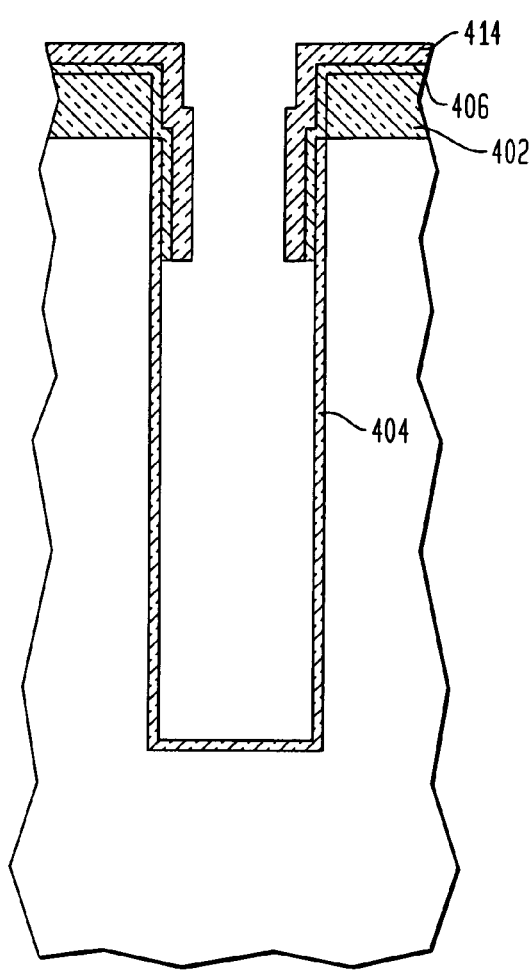

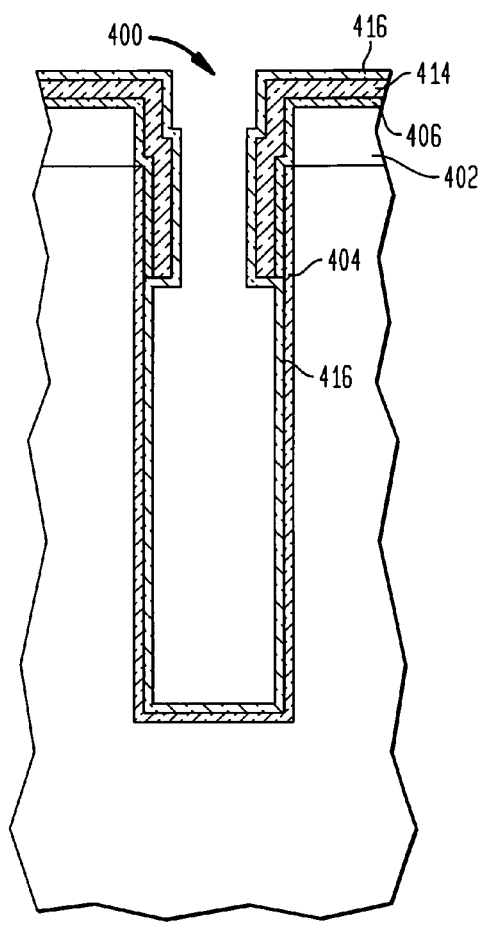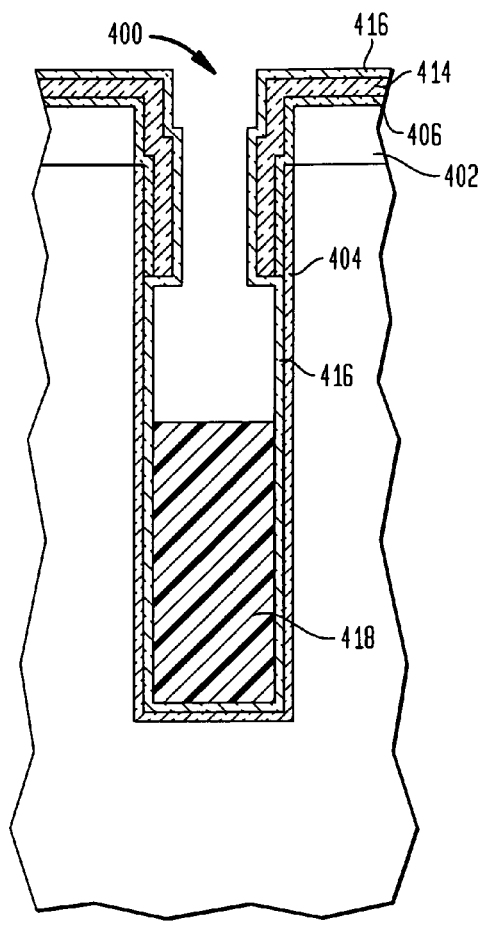

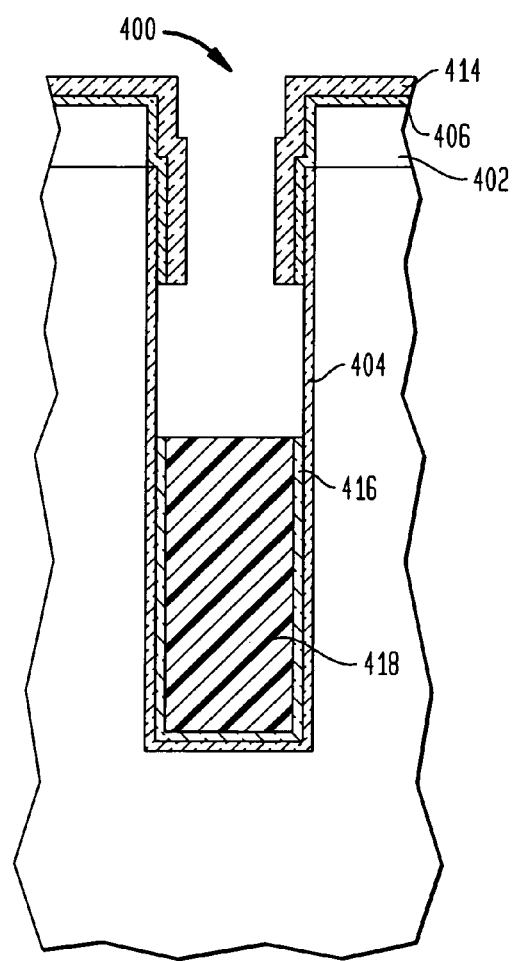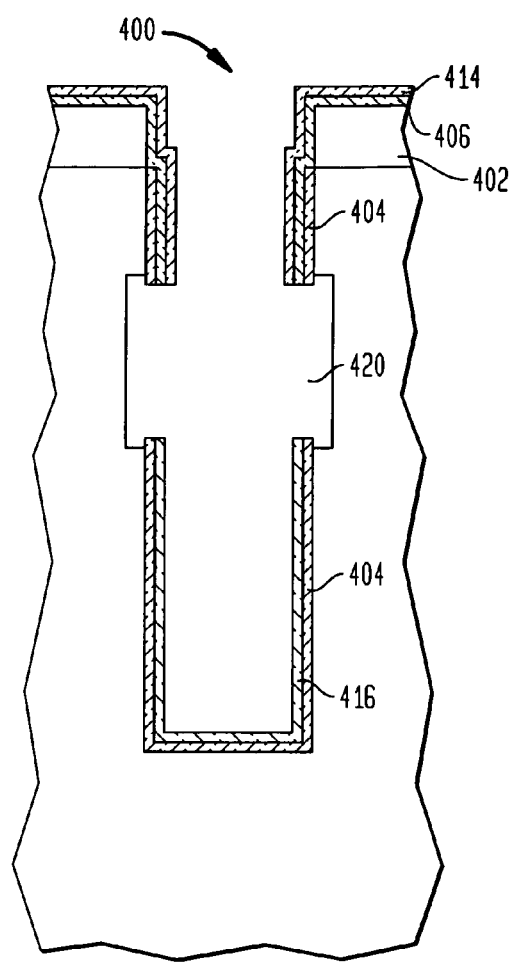

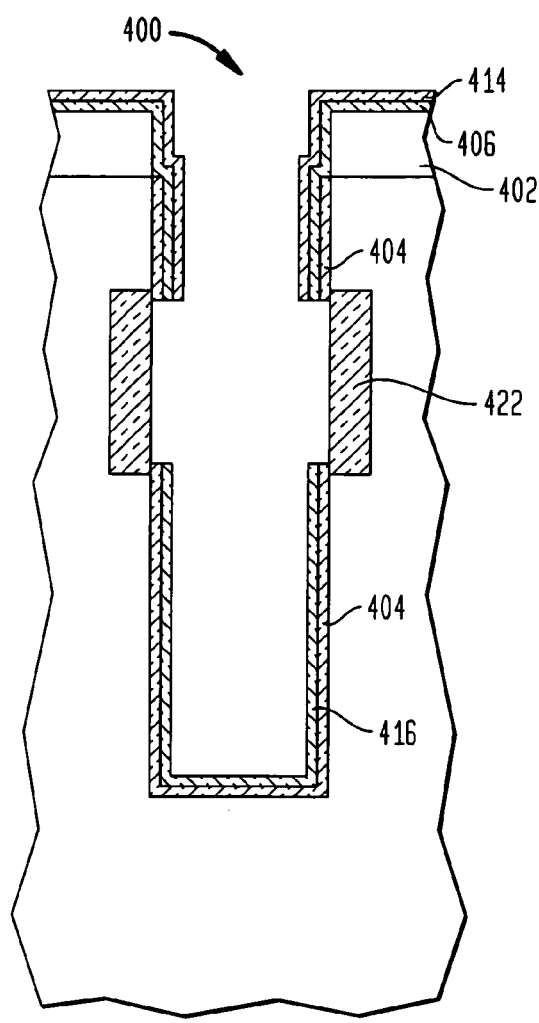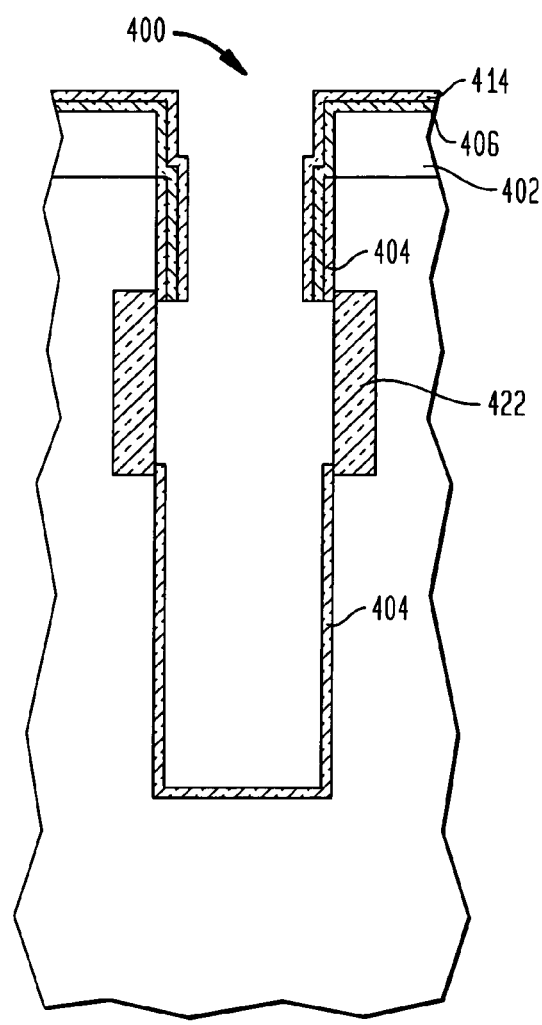

DEEP TRENCH CAPACITOR WITH BURIED PLATE ELECTRODE AND ISOLATION COLLAR

BACKGROUND OF THE INVENTION

The present invention is directed to semiconductor devices and, more particularly, to the fabrication and arrangement of deep trench structures used in semiconductor devices.

Present methods of fabricating the deep trench structures of a semiconductor device are often costly and require process steps that are hard to control. As an example of a deep trench fabrication process, a pad oxide layer and a pad nitride layer are first deposited atop a silicon substrate, and then a hard mask layer is deposited atop the nitride layer. The hard mask layer and the pad nitride layer are then patterned and etched using a lithographic step, and the hard mask layer is then used to mask the etching of a deep trench.

Next, the hard mask layer is removed, and a doped glass layer is deposited along the walls and bottom of the trench as well as atop the nitride layer. A further step is then carried out to pattern and remove the doped glass from atop the nitride layer and from the walls of the upper portion of the trench. An oxide cap is then deposited over the remaining portion of the doped glass, as well as over the walls of the rest of the trench and atop the nitride layer, and an anneal step is carried out to drive dopants from the doped glass into the silicon substrate and form a buried plate. The oxide cap and the doped glass are then removed, and a thin dielectric layer is deposited along the sides of the trench.

The lower portion of the trench is filled with polysilicon to form the node conductor. The top surface of the device is then planarized to remove any portion of the polysilicon that is atop the nitride layer, and the polysilicon is recessed to the intended depth of the collar. The dielectric film is removed from the exposed upper portion of the trench, and the trench collar oxide layer is then deposited and directionally etched back to remove any portion of the trench collar oxide layer that is atop the nitride layer and on top of the node polysilicon. The remainder of the polysilicon layer is next deposited, and the device is again planarized to remove any polysilicon that is atop the nitride layer. The nitride layer protects the surrounding silicon during the polysilicon etch step.

The trench collar oxide is then recessed back preferably using a wet etch step. The oxide recess forms a divot at a location where the collar oxide is removed below the level of polysilicon fill. The divot is then filled by again filling the trench with polysilicon and then recessing the polysilicon to a desired level. The polysilicon region is subsequently doped in high temperature processing steps by the prior deposited polysilicon, and the dopant subsequently out-diffuses into the substrate to form a buried strap region.

As semiconductor devices become increasingly smaller, the aspect ratio, namely the ratio of the height of the trench to the width of the trench, increases making such known processes harder to control. Further, it is also desirable to form trenches having shapes other than the structure fabricated by the known process and to increase the capacitors of the device.

It is therefore desirable to provide a process for fabricating a deep trench structure of a semiconductor device and the arrangement of such a structure that overcomes the above problems.

SUMMARY OF THE INVENTION

The present invention addresses these problems by providing an improved deep trench structure in which a buried plate is located below an isolation collar and is self-aligned to the collar and in which a hemispherical grain (HSG) polysilicon is incorporated to improve the capacitance.

In accordance with an aspect of the invention, a deep trench structure is formed in a semiconductor substrate. An upper region is lined with at least one insulator layer, and a lower region is wider than the upper region. The lower region has an upper part in which a collar oxide is formed and has a lower part and a bottom that is surrounded by doped buried plate region formed in the substrate and self-aligned to the collar oxide.

In accordance with another aspect of the invention, a deep trench structure is formed in a semiconductor substrate. An upper region is lined with at least one insulator layer, and a lower region is wider than the upper region. The lower region has an upper part in which a collar oxide is formed and has a lower part and a bottom that is surrounded by a doped buried plate region formed in the substrate. A doped, hemispherical grain (HSG) polysilicon layer at least lines the lower part and the bottom of the lower region.

In accordance with yet another aspect of the invention, a deep trench structure is formed in a semiconductor substrate. An upper region is lined with at least one insulator layer, and a lower region is wider than the upper region. The lower region has an upper part in which a collar oxide is formed and has a lower part and a bottom that is surrounded by dope buried plate region formed in the substrate. The upper part of the lower region and the lower part of the lower region have different widths.

According to a further aspect of the invention, a bottle-shaped deep trench structure is formed. A deep trench is formed in the semiconductor substrate. A polysilicon liner layer is then deposited along the bottom and sidewalls of the deep trench, and another liner layer is deposited atop the polysilicon liner layer. A portion of another liner layer that lines a lower region of the deep trench is covered with a resist material so that a remaining portion of another liner layer that lines an upper region of the deep trench is exposed. The exposed portion of another liner layer is removed to expose an underlying portion of the polysilicon liner layer, and the resist material is removed to expose the lower portion of the another liner layer. A further layer is formed from the exposed portion of the polysilicon liner layer. The lower portion of the other liner layer and an underlying portion of the polysilicon liner layer are removed using the further layer as a mask so that sidewalls of the lower region of the deep trench are exposed. The sidewalls and the bottom of the lower region of the deep trench are etched so that the deep trench has a bottle shape.

According to a still further aspect of the invention, an oxide collar is formed in a bottle-shaped deep trench that has an upper region lined with at least one insulator layer and a lower region that is wider than the upper region. An oxide is formed on a bottom and sidewall of the lower region. A polysilicon liner layer is deposited atop the at least one insulated layer of the upper region and atop the oxide of the lower region. Another liner layer is deposited atop the polysilicon liner layer. A portion of the another liner layer that lines a lower part and bottom of the lower region is covered with a resist material so that a remaining portion of the another liner layer that lines the upper part of the lower region and the upper region is exposed. The exposed portion of the another liner layer is removed to expose an underlying portion of the polysilicon liner layer, and the resist material is removed to expose the lower part of the lower portion of the another liner layer. A further layer is formed from the exposed portion of a polysilicon liner layer. The exposed portion of the another liner layer and an underlying portion of the polysilicon liner layer are removed using the further layer as a mask so that a portion of the formed oxide that covers the sidewalls and the bottom of the lower part of the lower region of the deep trench is exposed. The exposed portion of the oxide is etched so that the remaining portion that covers the upper part of the lower region forms the oxide collar.

According to yet a further aspect of the invention, a buried plate electrode is formed in a bottle-shaped deep trench formed in a semiconductor substrate. The bottle-shaped deep trench structure has an upper region that is lined with at least a nitride liner layer and has a lower region that is wider than the upper region. An upper part of the lower region has an oxide collar that is covered with the nitride liner layer. The bottom and sidewalls of at least a lower part of the lower portion of the deep trench is covered with a hemispherical grain (HSG) polysilicon layer. The hemispherical grain polysilicon layer and a portion of the semiconductor substrate that surround the lower part of the lower portion of the deep trench are doped. The nitride liner layer prevents dopants from entering a further portion of the semiconductor substrate that surrounds the upper region and that surrounds the upper part of the lower region of the deep trench.

According to yet a still further aspect of the invention, a deep trench structure is formed. A deep trench is formed in a semiconductor substrate. A polysilicon liner layer is deposited along a bottom and sidewalls of the deep trench. Another liner layer is deposited atop the polysilicon liner layer. A portion of the another liner layer that lines a lower region of the deep trench is covered with a resist material so that a remaining portion of the another liner layer that lines an upper region of the deep trench is exposed. The exposed portion of the another liner layer is removed to expose an underlying portion of the polysilicon liner layer, and the resist material is removed to expose the lower portion of the another liner layer. A further layer is formed from the exposed portion of the polysilicon liner layer. The lower portion of the another liner layer and an underlying portion of the polysilicon liner layer are removed using the further layer as a mask so that the sidewalls and the bottom of the lower region of the deep trench are exposed. The sidewalls and the bottom of the lower region of the deep trench are etched so that the deep trench has a bottle shape. An oxide is formed on the bottom and sidewalls of the lower region of the deep trench. A further polysilicon liner layer is deposited atop the at least one insulator layer of the upper region and atop the oxide of the lower region. Another further liner layer is deposited atop the polysilicon liner layer. A portion of the another further liner layer that lines a lower part and bottom of the lower region is covered with a further resist material so that a remaining portion of the another further liner layer that lines an upper part of the lower region and the upper region is exposed. The exposed portion of the another further liner layer is removed to expose an underlying portion of the further polysilicon liner layer. The further resist material is removed to expose the lower part of the lower portion of the another liner layer. A still further layer is formed from the exposed portion of the further polysilicon liner layer. The exposed portions of the another further liner layer and an underlying portion of the further polysilicon liner layer are removed using the still further layer as a mask so that a portion of the oxide that covers the sidewalls and bottom of the lower part of the lower region of the deep trench is exposed. The exposed portion of the oxide is etched so that a remaining portion that covers the upper part of the lower region forms an oxide collar. A bottom and sidewalls of at least the lower part of the lower region of the deep trench is covered with a hemispherical grain polysilicon layer. The hemispherical grain polysilicon layer and a portion of the semiconductor substrate that surrounds the lower part of the lower portion of the deep trench are doped. The nitride liner layer prevents dopants from entering a further portion of a semiconductor substrate that surrounds the upper region and that surrounds the upper part of the lower region of the deep trench.

According to still another aspect of the invention, an oxide collar is formed in a deep trench structure. A deep trench is formed in a semiconductor substrate. A polysilicon liner layer is the deposited along a bottom and sidewalls of the deep trench. Another liner layer is deposited atop the polysilicon liner layer. A portion of the another liner layer that lines a lower region of the deep trench is covered with a resist material so that a remaining portion of the another liner layer that lines the upper portion of the deep trench is exposed. The exposed portion of the another liner layer is removed to expose an underlying portion of the polysilicon liner layer. The resist material is removed to expose the lower portion of the another liner layer. A further layer is formed from the exposed portion of the polysilicon liner layer. The lower portion of the another liner layer and an underlying portion of the polysilicon liner are removed using the further layer as a mask so that the sidewalls and the bottom of the lower region of the deep trench are exposed. An additional liner layer is deposited atop the further layer and atop the sidewalls and the bottom of the lower region. A portion of the additional liner layer that lines a lower part and bottom of the lower region is covered with a further resist material so the remaining portion of the additional liner layer that lines an upper part of the lower region of the deep trench and lines the further layer is exposed. The exposed portion of the additional liner layer is removed to expose the sidewalls of the upper part of the lower region of the deep trench, and the further resist material is removed. The sidewalls of the upper part of the lower region of the deep trench are etched. An oxide is grown on the sidewalls of the upper part of the lower region of the deep trench to form the oxide collar.

According yet still another aspect of the invention, a buried plate electrode is formed in a bottle-shaped deep trench formed in a semiconductor substrate. The bottle-shaped deep trench has an upper region that is lined with at least a nitride liner layer and has a lower region that is wider than the upper region. An upper part of the lower region has an oxide collar. At least a lower part of the lower portion of the deep trench is covered with a hemispherical grain (HSG) polysilicon layer. The hemispherical grain (HSG) polysilicon layer and a portion of the semiconductor substrate that surrounds the lower part of the lower portion of the deep trench are doped. The nitride liner layer and the oxide collar prevent dopants from entering a further portion of the semiconductor substrate that surrounds the upper region and the upper part of the lower region of the deep trench.

In accordance with an additional aspect of the invention, a deep trench structure is formed. A deep trench is formed in a semiconductor substrate. A polysilicon liner layer is deposited along a bottom and sidewalls of the deep trench, and another liner layer is deposited atop the polysilicon liner layer. A portion of another liner layer that lines a lower region of the deep trench is covered with a resist material so that a remaining portion of the another liner layer that lines an upper portion of the deep trench is exposed. The exposed portion of the another liner layer is removed to expose an underlying portion of the polysilicon liner layer, and the resist material is removed to expose the lower portion of the another liner layer. A further layer is formed from the exposed portion of the polysilicon liner layer. The lower portion of the another liner layer and an underlying portion of the polysilicon liner layer are removed using the further layer as a mask so that the sidewalls and the lower region of the deep trench are exposed. An additional liner layer is the deposited atop the sidewalls and the bottom of the lower region. A portion the additional liner layer that lines a lower part and bottom of the lower region is covered with a further resist material so that a remaining portion of the additional liner layer that lines an upper part of the lower region of the deep trench and that lines the further layer is exposed. The exposed portion of the additional liner layer is removed to expose sidewalls of the upper part of the lower region of the deep trench, and the further resist material is removed. The sidewalls and the upper part of the lower region are etched, and an oxide is grown on the sidewalls on the upper part of the lower region of the deep trench to form an oxide collar. At least the additional liner layer is removed to expose sidewalls of the lower part region of the deep trench. The sidewalls of the lower part of the lower region of the deep trench is etched so that the deep trench has a bottle shape. At least the lower part of the lower portion of the deep trench is covered with a hemispherical grain (HSG) polysilicon layer. The hemispherical grain (HSG) polysilicon layer and a portion of the semiconductor substrate that surrounds the lower portion of the deep trench are doped. The nitride liner layer and the oxide collar prevent dopants from entering a further portion of the semiconductor substrate that surrounds the upper region and that surrounds the upper part of the lower region of the deep trench.

The foregoing aspects, features and advantages of the present invention will be further appreciated when considered with reference to the following description of the preferred embodiments and accompanying drawings.

BRIEF DESCRIPTION OF THE DRAWINGS

FIGS. 2–15 are cross-sectional diagrams illustrating the steps in process of the invention for fabricating the deep trench structure shown in FIG. 1.

FIGS. 16–29 are cross-sectional views illustrating an alternative process of the invention for fabricating a deep trench structure shown in FIG. 1.

FIGS. 30–41 are cross-sectional diagrams illustrating a further alternative process of the invention for fabricating a deep trench structure.

DETAILED DESCRIPTION

The present invention is directed to a structure of a deep trench having a buried plate and an isolation collar, such as is used in a dynamic random access memory (DRAM), and the processes for fabricating such a structure. The isolation collar is located in the upper portion of a deep trench, and a buried plate doped region is formed in the semiconductor substrate below the isolation collar and is self-aligned to the collar. The deep trench structure and process of the invention are particularly applicable to deep trenches having a high aspect ratio.

Figure 1:
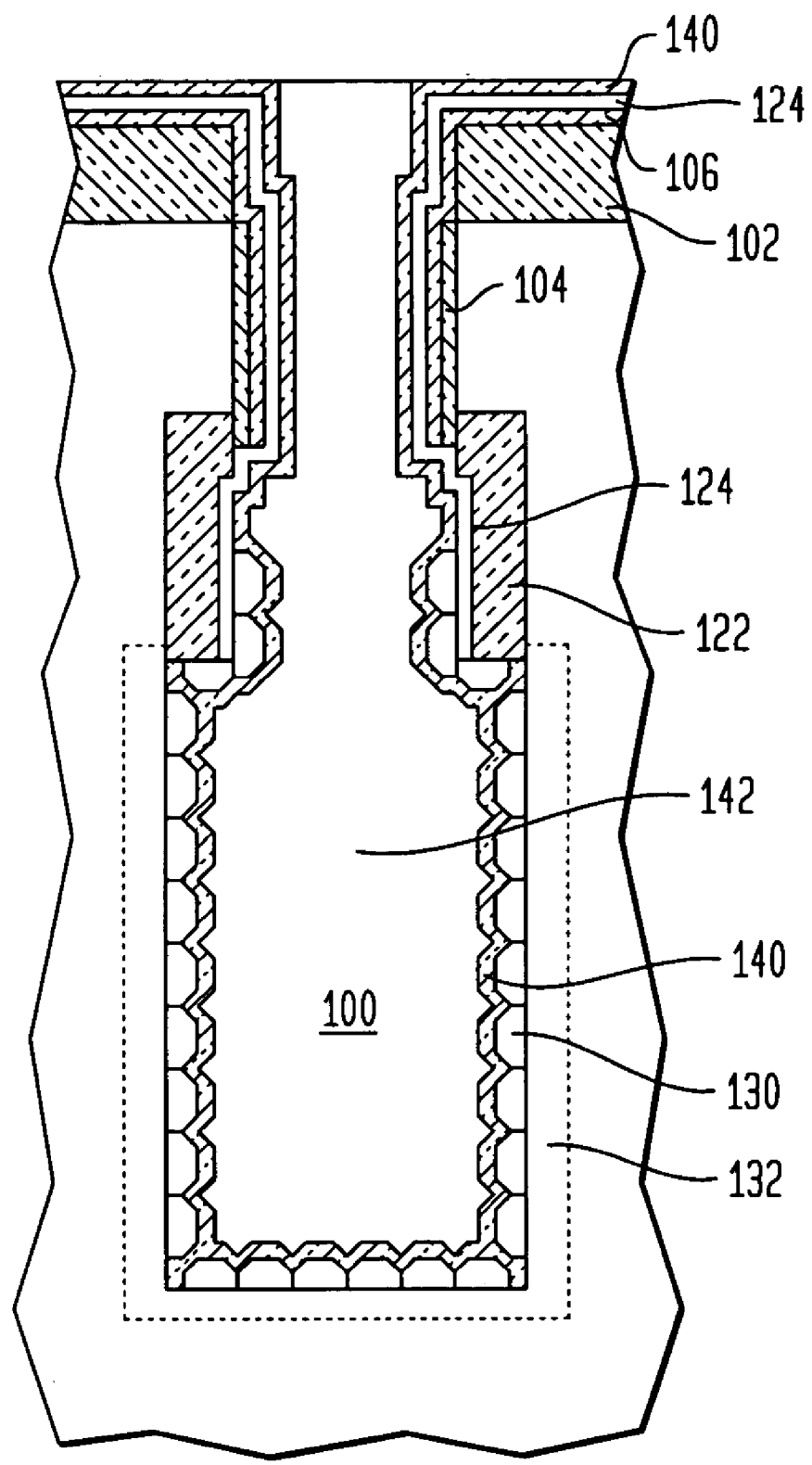
FIG. 1 is a cross-sectional diagram showing a portion of a semiconductor substrate having a deep trench capacitor with a buried plate and an isolation collar in accordance with an aspect of the invention

FIG. 1 illustrates a deep trench capacitor structure in accordance with an embodiment of the invention. A deep trench 100 is formed in the semiconductor substrate and has a bottle shape with the wider portion below the surface of the substrate preferably about 0.8 µm below the surface. An isolation collar 122, which is typically an oxide, surrounds part of the narrower portion of the bottle-shaped trench and extends from below the top of the surface to the top of the wider part of the bottle-shaped deep trench. The remaining upper portion of the narrower portion of the bottle shaped trench is lined with a thin oxide layer 104, a thin nitride layer 106, a thin polysilicon layer 124, and a thin nitride layer 140. The thin oxide layer 104 extends from the surface of the semiconductor substrate down to a portion of the isolation collar 122. The thin nitride layer 106 also extends downward from the surface of the semiconductor substrate into a part of the trench surrounded by the isolation collar 122 and also extends upward over the side and top of a pad nitride layer 102 formed on the top surface of the semiconductor substrate. The thin polysilicon layer 124 covers the thin nitride layer 106 but extends further down along the walls of the trench to the same depth as the isolation collar 122.

A hemispherical (HSG) grain polysilicon layer 130 lines the walls and bottom of the wider part of the deep trench and partially lines the portion of the trench that is surrounded by the isolation collar 122. The hemispherical grain structure of the polysilicon increases the surface area of the polysilicon layer and thus increases the capacitance of the deep trench capacitor. The hemispherical grain polysilicon is doped as is a region of the semiconductor substrate around the wider part of the deep trench that forms a doped buried plate region 132. The nitride liner layer 140 covers the hemispherical grain (HSG) polysilicon as well as the polysilicon liner layer 124. The remainder of the trench is filled with a doped polysilicon material 142.

FIGS. 2–15 illustrate steps of a process for forming the deep trench capacitor shown in FIG. 1 in accordance with an aspect of the invention.

As FIG. 2 shows, a deep trench 200 is formed and then lined with various layers. First a pad oxide layer (not shown) is deposited atop the semiconductor substrate, and a pad nitride layer 202 is deposited atop the pad oxide layer. Then, a hardmask layer (not shown) is deposited atop the nitride layer 202, and a photolithographic step is carried out to mask the etching of the hardmask layer. The hardmask layer and the pad nitride layer 202 are then etched, and the hardmask layer is then used to mask the etching of the deep trench 200. The hardmask layer is then removed.

Next, a thin oxide layer 204 is grown along the walls and bottom of the deep trench 200 in a known manner and preferably have a thickness of 20 Å. Then, a thin nitride liner layer 206 is deposited atop the thin oxide layer 204 as well as along the sides and top of the pad nitride layer 202. The nitride liner layer preferably has a thickness of 80 Å. Then, a polysilicon liner layer 208 having a thickness of, preferably, 100 Å is deposited atop the nitride liner layer 206, and a further nitride liner layer 210 having a preferred thickness of 60 Å is deposited atop the polysilicon liner layer 208.

A resist layer 212 is then deposited to at least fill the deep trench 200 as well as cover the substrate. Then, as shown in FIG. 3, a portion of the resist that fills the uppermost portion of the deep trench 200 is removed as well as a portion of the resist that covers the substrate. The exposed portion of the further nitride liner layer 210 is then removed, preferably using a chemical dry etch (CDE) process or other isotropic etch.

Next, as FIG. 4 shows, the resist layer 212 is removed and the exposed portion of the polysilicon liner layer that lines the uppermost portion of the deep trench 200 as well as covers the pad nitride layer 202 is oxidized to form oxide layer 214. The oxidation step is carried out using a selective process that oxidizes the polysilicon but which does not oxidize the polysilicon beneath the remaining part of the further nitride liner layer 210.

Then, as shown in FIG. 5, the remaining further nitride liner layer 210 and the non-oxidized portion of the polysilicon liner layer 208 are removed, and a portion of the nitride liner layer 206 which is not covered by the oxidized polysilicon layer 214 is also removed. The removal steps are preferably carried out using a CDE process that is selective to oxide such that the oxide liner layer 204 remains and lines the deep trench 200. Further, the oxidized polysilicon 214 and a remaining portion of the nitride liner layer 206 also remain and cover the upper portion of the deep trench 200 as well as cover the pad nitride layer 202.

Next, as shown in FIG. 6, an oxide etch step is carried out that removes the oxidized polysilicon layer 214 as well as the exposed portion of the oxide liner layer 204. The oxide etch is carried out in the manner that is selective to nitride so that the portion of the nitride liner layer 206 that covers the upper region of the trench 200 and that covers the pad nitride layer 202 remains.

Then, as FIG. 7 shows, the exposed walls and bottom of a deep trench 200 are etched to remove part of the silicon substrate and form a bottle-shaped deep trench having a wider part 220 at the bottom region of the trench.

Thereafter, as shown in FIG. 8, a local oxidation of silicon (LOCOS) step is carried out which oxidizes the walls of the wider part 220 of the deep trench 200 and forms an oxide layer 222 that surrounds the walls and bottom of the wider part of the deep trench 200. The nitride layer 206 that lines the narrower, upper part of the deep trench 200 may be removed at this point in the process if a wider opening of the trench is desired.

Alternatively, instead of growing the oxide layer 222 using a LOCOS process, the oxide layer may be deposited in a known manner and then the portion of the oxide that is deposited over the nitride liner layer 206 is then removed, thereby leaving only the portion formed in the wider part of the deep trench.

Next, as FIG. 9 shows, another thin nitride liner layer 224, another polysilicon liner layer 226, and yet another nitride liner layer 228 are deposited. Preferably, the nitride liner layer 224 has a thickness of 60 Å, the polysilicon liner layer 226 has a thickness of 100 Å, and the nitride liner layer 228 has a thickness of 60 Å.

Then, as FIG. 10 shows, a further resist layer 230 is deposited to fill the deep trench 200 as well as to cover the nitride liner layer 228. The layer 230 is then partially removed down to a preferred depth of 1.4 µm below the surface of the semiconductor substrate. The exposed portions of the additional nitride liner layer 230 are then removed, preferably using a CDE step.

Next, as shown in FIG. 11, the resist layer 230 is removed, and the portions of the polysilicon liner layer 226 that are not covered by the nitride liner layer 228 are then oxidized to form an oxide layer 232 that lines the upper portion of the oxide collar 222 as well as covers the portion of the trench that is above the oxide collar.

Figure 12:
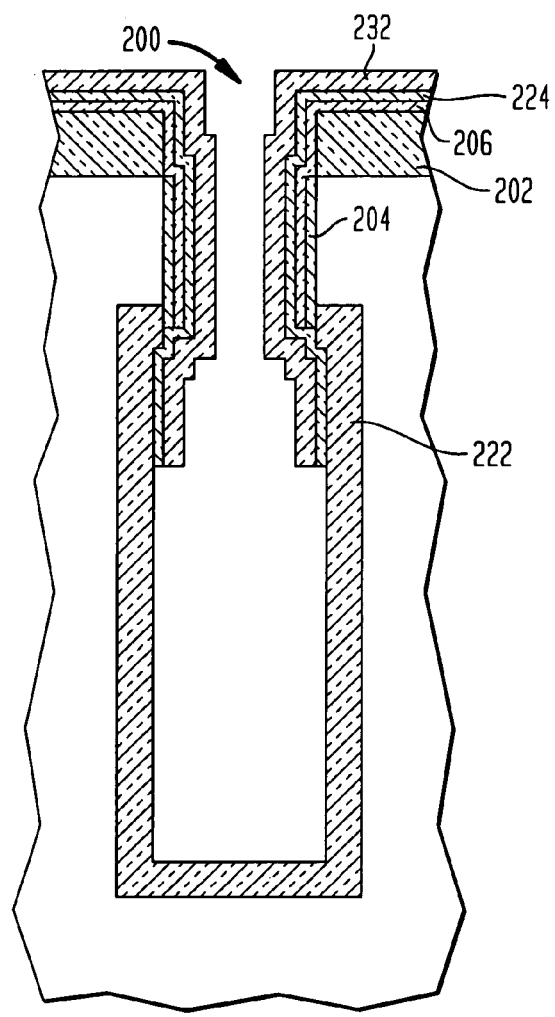

Next, as FIG. 12 shows, the remaining portions of the nitride liner layer 228 and the polysilicon liner layer 226 are removed, and the now exposed portions of the nitride liner layer 224 are also removed, leaving only the portion of the nitride liner layer 224 that is covered by the oxidized layer 232.

Figure 13:
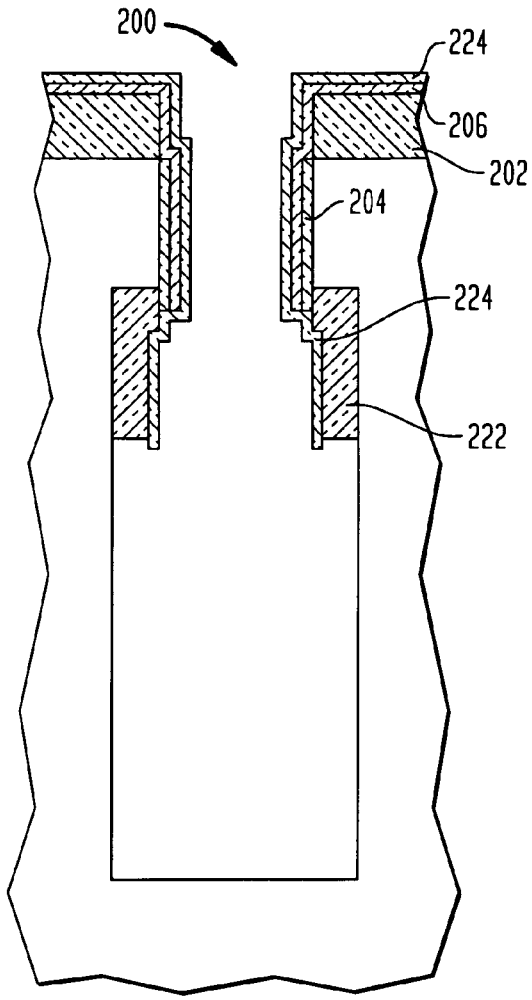

Then, the oxidized polysilicon layer 232 is removed, as shown in FIG. 13, and exposes a remaining portion of the nitride liner layer 224.

Thereafter, a layer of HSG polysilicon is deposited along the walls of the deep trench 200, and an upper portion of the HSG polysilicon is removed, as FIG. 14 shows.

Next, a gas phase doping step is carried out, as shown in FIG. 15, which dopes the remaining HSG polysilicon 230 as well as the portions of the silicon substrate beneath the HSG polysilicon to form a doped buried plate region 232. The dopant is preferably arsenic (As), though other n-type species may be used. The nitride liner layer 224 prevents the dopant used in the gas phase doping process from diffusing through the thin oxide liner layer 204 or through the collar oxide layer 222 into the silicon that surrounds the upper region of the deep trench. The resulting buried plate region is self-aligned to the collar oxide layer 222. Further, though the oxide collar 222 could be used to block the diffusion of the dopant, the thickness needed for such a layer is not desirable, and thus the presence of the nitride liner layer 224 allows for the use of a thinner oxide collar.

A further dilectric layer is then deposited along the walls and bottom of the deep trench 200 to form a node dilectric layer, and the remainder of the deep trench is filled with doped polysilicon, known as a node polysilicon layer, so that the node polysilicon layer and the HSG polysilicon layer forms the plates of a deep trench capacitor that is isolated from one another from the node dilectric layer.

The device may then be processed in a known manner to form the remaining structures of the DRAM.

FIGS. 16–27 illustrate the steps of an alternative process of the invention for forming the deep trench capacitor structure shown in FIG. 1.

First, as FIG. 16 shows, a pad nitride layer 302 and a deep trench 300 are formed in the manner described above with reference to FIG. 2, and an oxide liner layer 304, a nitride liner layer 306, a polysilicon liner layer 308 and a further oxide liner layer 310 are also deposited in the manner described above. Then, as shown in FIG. 17, a resist layer 312 is deposited and recessed and the exposed portions of the further oxide liner layer 310 are removed as described above with reference to FIG. 3.

Next, as FIG. 18 shows, the resist layer 312 is removed so that a remaining portion of the further oxide liner layer 310 covers part of the polysilicon liner layer 308. A nitride layer 314 is then formed from the uncovered part of the polysilicon layer 308.

Then, as shown in FIG. 19, the remainder of the further oxide liner layer 310 and the portion of the polysilicon layer 308 that is not covered by the nitride layer 314 are removed using a CDE step that is selective to the nitride layer 314. A portion of the nitride liner layer 306 and a part of the oxide liner layer 304 that were previously covered by the now removed part of the polysilicon liner layer 308 as well as the nitride layer 314 that covers the remaining part of the polysilicon liner layer 308 are then removed, as FIG. 20 shows, so that the walls of all but the uppermost part of the deep trench 300 are now exposed. Then, as shown in FIG. 21, the exposed walls and bottom of the deep trench 300 are then etched in the manner described above with reference to FIG. 7 so that the deep trench now has a bottle shape having a wider part 320 formed as a result of the etching step.

Next, as shown in FIG. 22, a LOCOS step is carried out as described above with reference to FIG. 8. An optional step of removing the remaining part of the nitride liner layer 306 may also be carried out as described above.

Then, as FIG. 23 shows, another nitride liner layer 324 and another polysilicon liner layer 326 are deposited in the manner described above with reference to FIG. 9. However, in place of the 60 Å thick nitride liner layer that is shown in FIG. 9, an additional oxide liner layer 328 is deposited and has a thickness of preferably 50 Å.

Figure 24:
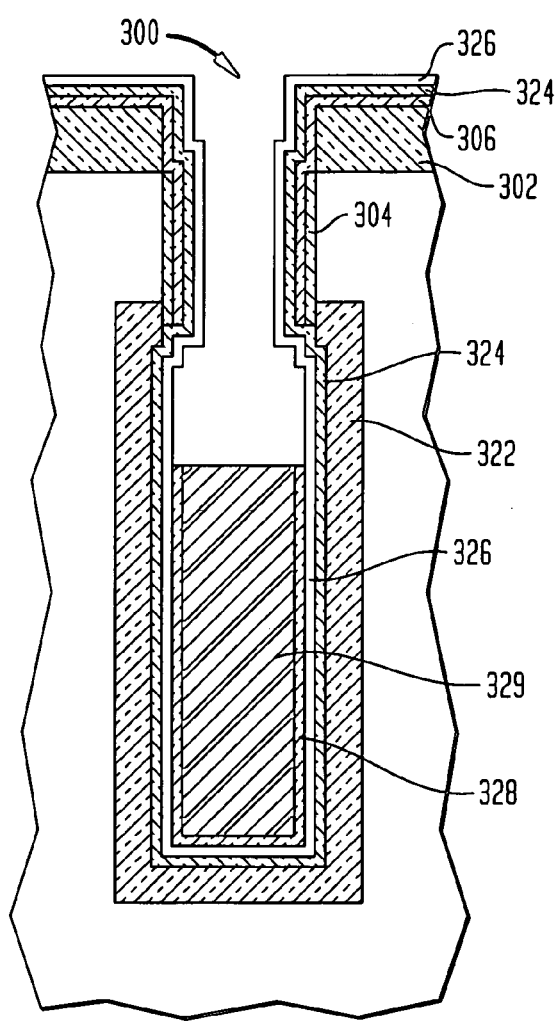
Figure 25:
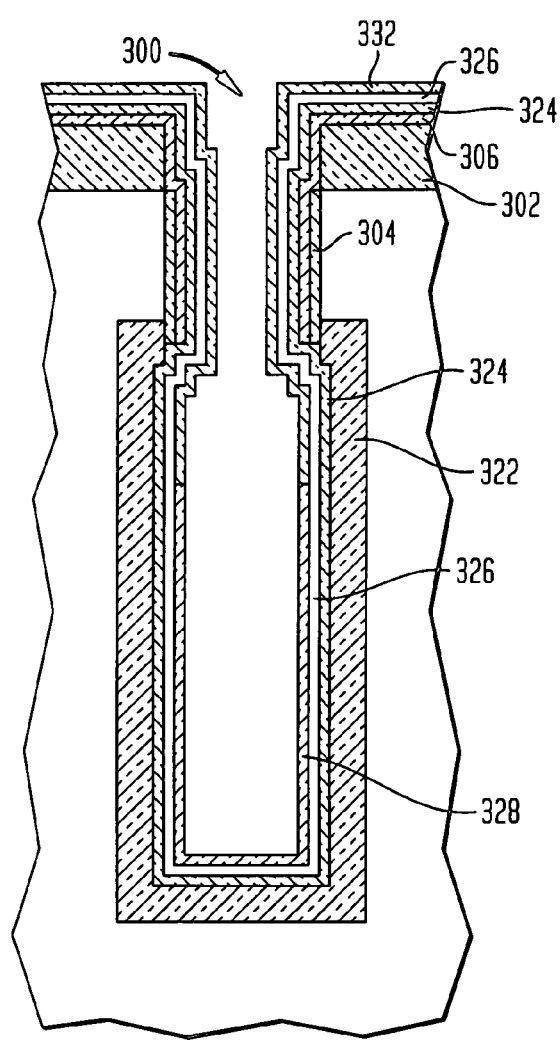

Then, as FIG. 24 shows, a further resist layer 330 is deposited and recessed to a depth of, preferably, 1.4 µm as described above. The exposed portions of the oxide liner layer 328 are then removed using an etching step that removes the oxide but is selective to the further resist layer 330 and the now exposed portions of the polysilicon layer 326. The resist layer 330 is then removed, and a further nitride layer 332 is grown from the now exposed portions of the polysilicon liner layer 326, as FIG. 25 shows.

Next, as depicted in FIG. 26, the remaining portion of the oxide liner layer 328 and the portion of the polysilicon liner layer 326 that is not covered by the nitride layer 332 are then removed using an etch step that is selective to the nitride so that the nitride layer 332 and all its underlying layers remain. The nitride layer 332 and the now exposed part of the nitride liner layer 324 are next removed in a manner that is selective to the underlying polysilicon liner layer 326, as FIG. 27 shows, and the polysilicon liner layer 326 is then removed in a selective manner that leaves the underlying, remaining part of the nitride liner layer 324. An oxide etch step that is selective to the nitride layer may also be carried out.

Figure 28:
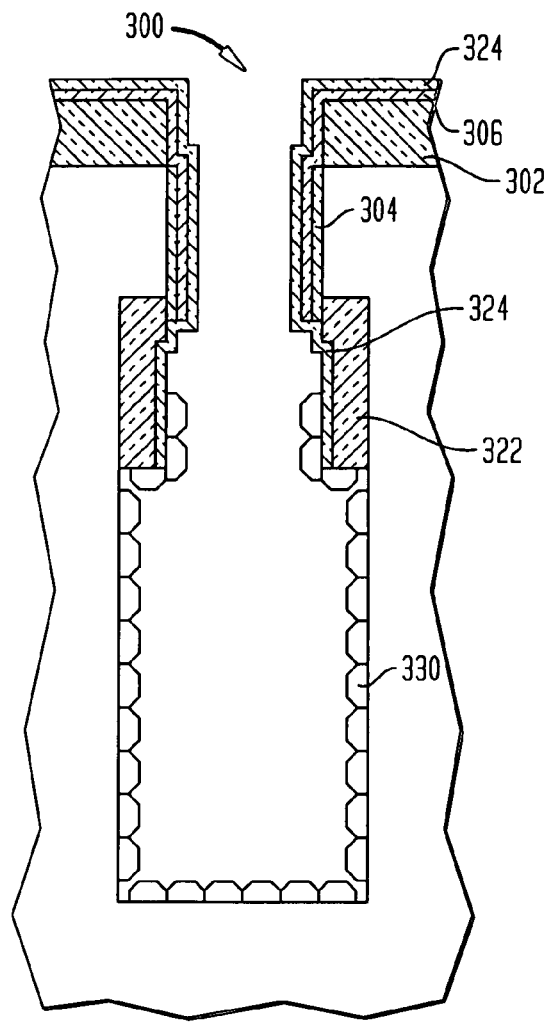
Figure 29:
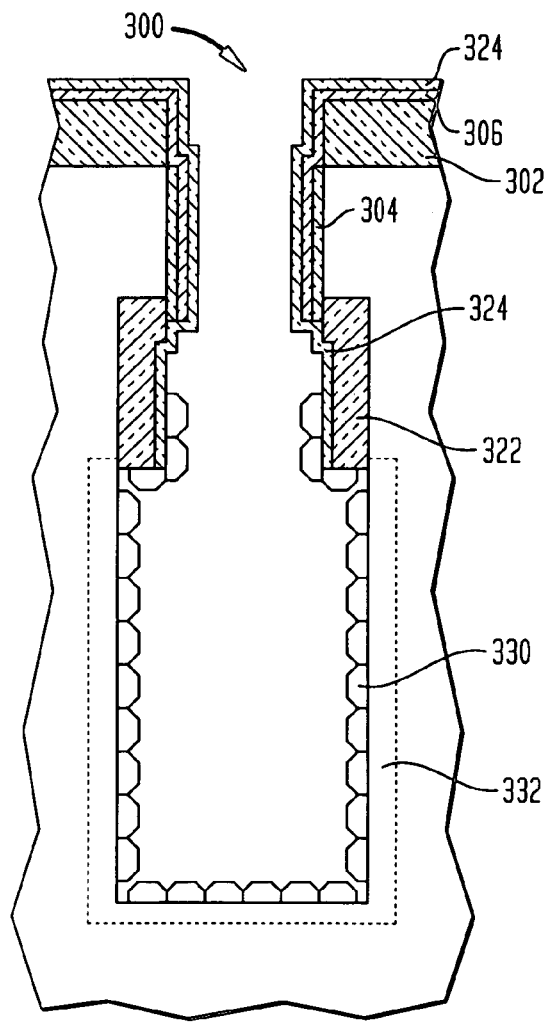

Thereafter, as FIG. 28 shows, an HSG polysilicon layer 330 is deposited and recessed in the manner described above with reference to FIG. 28. The HSG polysilicon layer 330 and a portion of the silicon substrate are doped, preferably with an As dopant, using gas phase doping and form a buried plate region 332 in the manner described above, as FIG. 29 shows. The remaining part of the nitride liner layer 324 serves to prevent doping of the silicon surrounding the upper part of the trench. The deep trench structure may be further processed in the manner also described above.

The resulting deep trench structure is similar to that formed using the process described above in FIGS. 2–15 except that a polysilicon nitride layer is substituted for the oxidized polysilicon layer, and then an oxide etch step that is selective to the nitride is carried out in place of a nitride etch step that is selective to an oxide.

FIGS. 30–41 illustrate a further process of the invention in which a deep trench structure is formed having a modified configuration.

First, as FIG. 30 shows, a pad nitride layer 402 and a deep trench 400 are formed in the manner described above with reference to FIG. 2, and an oxide liner layer 404, a nitride liner layer 406, a polysilicon liner layer 408, and a further nitride liner layer 410 are also formed as described above. Next, as shown in FIG. 31, a resist layer 412 is deposited and recessed to a depth of, preferably, 0.8 µm, and the exposed portions of the nitride liner layer 410 are removed as described above regarding FIG. 3.

Then, as FIG. 32 shows, the resist layer 412 is removed, and the now exposed part of the polysilicon liner layer 408 is oxidized to form an oxide layer 414, as are described above with reference to FIG. 4. The portions of the nitride liner layer 410, polysilicon liner layer 408, nitride liner layer 406 that are not covered by the oxide layer 414 are then removed in the manner shown with reference to FIG. 5, as FIG. 33 shows.

Then, as shown in FIG. 34, another nitride liner layer 416 is deposited and has a preferred thickness to 60 Å. A further resist layer 418 is deposited and then recessed down to a preferred depth of 1.4 µm, as FIG. 35 shows.

Next, as FIG. 36 shows, a CDE step is carried out that removes a portion of the nitride liner layer 416 that is not covered by the oxide layer 414 or by the resist layer 418 in the manner that is selective to the resist layer and the underlying oxide layer 404 so that a portion of the oxide liner layer 404 that extends from the bottom of the oxide layer 414 to the top of the resist layer 418 is exposed. The resist layer 418 is then removed, as shown in FIG. 37, and the exposed portion of the oxide liner layer 404 as well as the oxide layer 414 are removed. Then, the portion of the silicon underlying the now removed part of the oxide liner layer 404 is etched to form a "bottle shaped trench" having a wider region 420 formed in the middle portion of the trench.

Next, a LOCOS step is carried out to form an oxide collar 422 in the region of the etched silicon substrate at the middle portion of the trench. The remaining portion of the nitride liner layer 416 is then removed and exposes the portion of the oxide liner layer 404 that covers the lower part of the walls and the bottom of the deep trench, as FIG. 39 shows.

Figure 40:
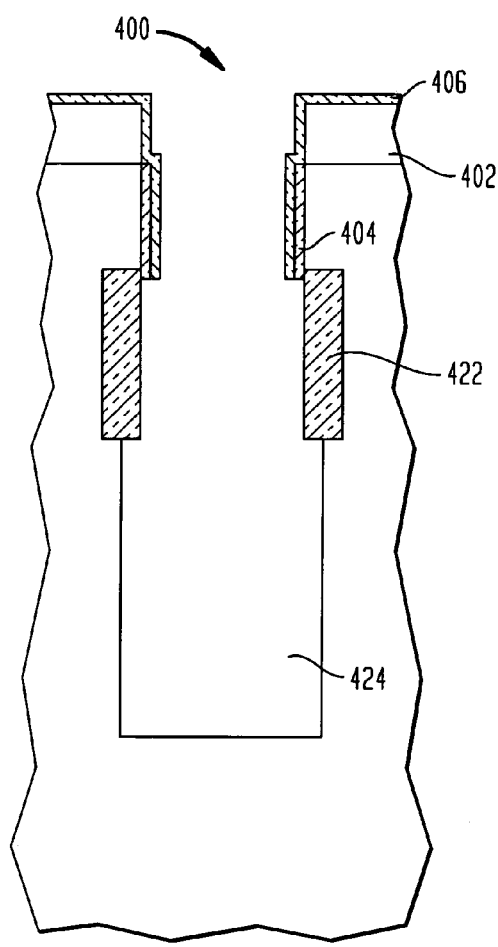

Next, as shown in FIG. 40, the polysilicon oxide layer 404 and the exposed portion of the oxide liner layer 404 are removed. The removal of the lower portion of the oxide liner layer 404 exposes the lower part of the walls of the deep trench and the bottom of the deep trench which are then etched to now form a bottle-shaped structure having a wider part 424 located at the lower portion of the trench.

Figure 41:
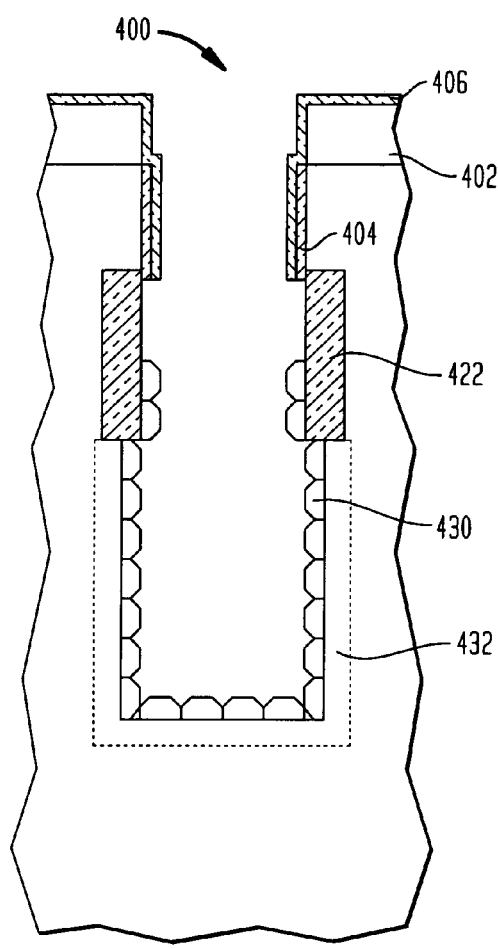

Thereafter, as FIG. 41 shows, a layer of HSG polysilicon is deposited and recessed in the manner described above. A gas phase doping step is carried out to dope the HSG polysilicon and form a doped buried plate region 432, and further process steps are carried out through the manner described above.

The process shown in FIGS. 30–41 differs from the processes described above in that the portion of the bottle-shaped region that forms the oxide collar is etched independently of the portion that forms the buried plate. As a result, the two portions of the deep trench may be etched to different widths and optimized for each part of the deep trench. Moreover, because the nitride liner layer 406 does not extend over the oxide collar 422, only the collar oxide is present to prevent dopant diffusion into the portion of the silicon substrate that adjoins the collar oxide, and thus the oxide collar is preferably thicker than in the embodiment shown in FIG. 1.

An advantage of the invention is that resist deposition and recessing steps are carried out in place of repeated polysilicon fill and recessing steps, resulting in a less expensive and easier to control process. Further, the processes of the invention allow for the formation of a deep trench having a bottle-shaped structure in which an opening to the bottom of the trench is formed earlier in the deep trench formation process. As a further advantage, the processes of the invention allow for a capacitor electrode formed of hemispherical grain (HSG) polysilicon which increases the surface area of the capacitor plate, thereby increasing the capacitance of the capacitor. Additionally, the invention permits the formation of the bottle shape of the trench prior to the formation of the collar oxide and further permits the formation of a capacitor having increased capacitor area.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a bottle-shaped deep trench structure, said method comprising:
    forming a deep trench in a semiconductor substrate;

depositing a polysilicon liner layer along a bottom and sidewalls of said deep trench;

depositing another liner layer atop said polysilicon liner layer;

covering a portion of said another liner layer that lines a lower region of said deep trench with a resist material so that a remaining portion of said another liner layer that lines an upper region of said deep trench is exposed;

removing said exposed remaining portion of said another liner layer to expose an underlying portion of said polysilicon liner layer;

removing said resist material to expose a lower portion of said another liner layer lining said lower region of said deep trench;

forming a further layer from said exposed underlying portion of said polysilicon liner layer;

removing said lower portion of said another liner layer and said underlying portion of said polysilicon liner layer using said further layer as a mask so that said sidewalls and said bottom at said lower region of said deep trench are exposed; and etching said sidewalls and said bottom at said lower region of said deep trench so that said deep trench has a bottle shape.

2. The method of claim 1 wherein said step of covering with a resist material comprises:

filling said deep trench with said resist material; and removing said resist material from said upper region of said deep trench.

3. The method of claim 1 wherein said another liner layer is one of an oxide liner layer and a nitride liner layer, and said further layer is an oxide when said another liner layer is said nitride liner layer and said further layer is a nitride when said another liner layer is said oxide liner layer.

4. The method of claim 1 further comprising:

depositing an underlying nitride liner layer prior to depositing said polysilicon liner layer; and removing a lower portion of said underlying nitride liner layer after removing said lower portion of said another liner layer and said underlying portion of said polysilicon liner layer.

5. The method of claim 3 further comprising:

growing an oxide liner layer and then forming a nitride liner layer; and removing a lower portion of said oxide liner layer after removing a lower portion of said nitride liner layer.

6. A method of forming a deep trench structure, said method comprising:

forming a deep trench in a semiconductor substrate;

depositing a polysilicon liner layer along a bottom and sidewalls of said deep trench;

depositing another liner layer atop said polysilicon liner layer;

covering a portion of said another liner layer that lines a lower region of said deep trench with a resist material so that a remaining portion of said another liner layer that lines an upper region of said deep trench is exposed;

removing said exposed remaining portion of said another liner layer to expose an underlying portion of said polysilicon liner layer;

removing said resist material to expose a lower portion of said another liner layer;

forming a further layer from said exposed underlying portion of said polysilicon liner layer;

removing said lower portion of said another liner layer and said underlying portion of said polysilicon liner layer using said further layer as a mask so that said sidewalls and said bottom at said lower region of said deep trench are exposed;

etching said sidewalls and said bottom of said lower region of said deep trench so that said deep trench has a bottle shape;

forming an oxide on said bottom and sidewalls of said lower region of said deep trench;

depositing a further polysilicon liner layer atop said at least one insulator layer of said upper region and atop said oxide of said lower region;

depositing another further liner layer atop said polysilicon liner layer;

covering a portion of said another further liner layer that lines a lower part and bottom of said lower region with a further resist material so that a remaining portion of said another further liner layer that lines an upper part of said lower region and said upper region is exposed;

removing said exposed remaining portion of said another further liner layer to expose an underlying portion of said further polysilicon liner layer;

removing said further resist material to expose said lower part of said lower portion of said another further liner layer;

forming a still further layer from said exposed portion of said further polysilicon liner layer;

removing said exposed portion of said another further liner layer and an underlying portion of said further polysilicon liner layer using said still further layer as a mask so that a portion of said oxide that covers said sidewalls and said bottom of said lower part of said lower region of said deep trench is exposed;

etching said exposed portion of said oxide so that a remaining portion that covers said upper part of said lower region forms an oxide collar;

covering a bottom and sidewalls of at least said lower part of said lower portion of said deep trench with a hemispherical grain (HSG) polysilicon layer; and doping said hemispherical grain (HSG) polysilicon layer and a portion of said semiconductor substrate that surrounds said lower part of said lower portion of said deep trench, said nitride liner layer preventing dopants from entering a further portion of said semiconductor substrate that surrounds said upper region and that surrounds said upper part of said lower region of said deep trench.

7. The method of claim 6 wherein said another liner layer and said further another liner layer are one of an oxide liner layer and a nitride liner layer, and said further layer and said still further layer are an oxide when said another liner layer and said further another liner layer are a nitride and said further layer and said still further layer are a nitride when said another liner layer and said further another liner layer are an oxide.

8. The method of claim 6 wherein said step of covering with a resist material comprises:

filling said deep trench with said resist material; and removing said resist material from said upper region of said deep trench.

9. The method of claim 6 further comprising:

depositing an underlying nitride liner layer prior to depositing said polysilicon liner layer; and removing a lower portion of said underlying nitride liner layer after removing said lower portion of said another liner layer and said underlying portion of said polysilicon liner layer.

10. The method of claim 9 further comprising:
growing an underlying oxide liner layer prior to depositing said underlying nitride liner layer; and
removing a lower portion of said underlying oxide liner layer after removing said lower portion of said underlying nitride liner layer.

11. The method of claim 6 wherein said step of covering with a further resist material comprises:
filling said deep trench with said further resist material; and
removing said further resist material from said upper portion of said deep trench and from said upper part of said lower region of said deep trench.

12. The method of claim 6 wherein said step of forming an oxide comprises is selected from the group consisting of growing said oxide on said bottom and sidewalls of said lower region; and depositing said oxide on said bottom and sidewalls of said upper and lower regions and removing said oxide from said sidewalls of said upper region.

13. The method of claim 6 further comprising:
depositing an underlying further nitride liner layer prior to depositing said further polysilicon liner layer; and
removing a portion of said underlying further nitride liner layer after removing said exposed portion of said another further liner layer and said underlying portion of said further polysilicon liner layer.

14. The method of claim 6 further comprising: removing said at least one insulator layer from said upper portion of said deep trench prior to depositing said further polysilicon liner layer.

15. The method of claim 6 wherein said hemispherical grain (HSG) polysilicon layer further lines at least a portion of said upper part of said lower region.

16. The method of claim 6 wherein said step of covering with a hemispherical grain (HSG) polysilicon layer comprises:
depositing said hemispherical grain (HSG) polysilicon layer atop a bottom and sidewalls of said upper and lower portions of said deep trench; and
removing said hemispherical grain (HSG) polysilicon layer from said upper portion of said deep trench and from at least a portion of said upper part of said lower region of said deep trench.

17. The method of claim 6 wherein said doping step comprises a gas phase doping step.

18. The method of claim 6 further comprising: depositing a dielectric layer that covers at least said hemispherical grain (HSG) polysilicon layer.

19. The method of claim 18 further comprising: depositing a doped polysilicon
material that fills said upper region and said lower region.

20. A method of forming an oxide collar in a deep trench structure, said method comprising:
forming a deep trench in a semiconductor substrate;
depositing a polysilicon liner layer along a bottom and sidewalls of said deep trench;
depositing another liner layer atop said polysilicon liner layer;
covering a portion of said another liner layer that lines a lower region of said deep trench with a resist material so that a remaining portion of said another liner layer that lines an upper region of said deep trench is exposed;
removing said exposed remaining portion of said another liner layer to expose an underlying portion of said polysilicon liner layer;
removing said resist material to expose a lower portion of said another liner layer;
forming a further layer from said exposed underlying portion of said polysilicon liner layer;
removing said lower portion of said another liner layer and said underlying portion of said polysilicon liner layer using said further layer as a mask so that said sidewalls and said bottom at said lower region of said deep trench are exposed;
depositing an additional liner layer atop said further layer and atop said sidewalls and said bottom of said lower region;
covering a portion of said additional liner layer that lines a lower part and a bottom of said lower region with a further resist material so that a remaining portion of said additional liner layer that lines an upper part of said lower region of said deep trench and that lines said further layer is exposed;
removing said exposed remaining portion of said additional liner layer to expose sidewalls of said upper part of said lower region of said deep trench;
removing said further resist material;
etching said sidewalls of said upper part of said lower region of said deep trench; and
growing an oxide on said sidewalls of said upper part of said lower region of said deep trench to form said oxide collar.

21. The method of claim 20 wherein said further layer is an oxide and said another liner layer is a nitride liner layer.

22. The method of claim 20 wherein said step of covering with a resist material comprises:
filling said deep trench with said resist material; and
removing said resist material from said upper region of said deep trench.

23. The method of claim 20 wherein said step of covering with a further resist material comprises:
filling said deep trench with said further resist layer; and
removing said further resist layer from said upper portion of said deep trench and from said upper part of said lower region of said deep trench.

24. The method of claim 20 further comprising:
depositing an underlying nitride liner layer prior to depositing said polysilicon liner layer; and
removing a lower portion of said underlying nitride liner layer after removing said lower portion of said another liner layer and said underlying portion of said polysilicon liner layer.

25. The method of claim 24 further comprising:
growing an underlying oxide liner layer prior to depositing said underlying nitride liner layer; and
removing an upper part of said lower portion of said underlying oxide liner layer after removing said exposed portion of said additional liner layer.

26. The method of claim 24 further comprising:
removing at least said additional liner layer to expose sidewalls of said lower part of said lower region of said deep trench; and
etching said sidewalls of said lower part of said lower region of said deep trench so that said deep trench has a bottle shape.

* * * * *